(12) United States Patent
Yoon et al.

(10) Patent No.: US 11,263,965 B2
(45) Date of Patent: Mar. 1, 2022

(54) PIXEL, AND ORGANIC LIGHT-EMITTING DISPLAY DEVICE COMPRISING THE SAME

(71) Applicant: Samsung Display Co., Ltd., Yongin-si (KR)

(72) Inventors: Youngsoo Yoon, Yongin-si (KR); Wonkyu Kwak, Yongin-si (KR); Jihyun Ka, Yongin-si (KR); Jisu Na, Yongin-si (KR); Kyonghwan Oh, Yongin-si (KR); Yunkyeong In, Yongin-si (KR); Haijung In, Yongin-si (KR); Hyunji Cha, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/115,256

(22) Filed: Dec. 8, 2020

(65) Prior Publication Data
US 2021/0343234 A1 Nov. 4, 2021

(30) Foreign Application Priority Data
Apr. 29, 2020 (KR) .......................... 10-2020-0052883

(51) Int. Cl.
*G09G 3/30* (2006.01)
*G09G 3/3225* (2016.01)
(Continued)

(52) U.S. Cl.
CPC ......... *G09G 3/3225* (2013.01); *G09G 3/3266* (2013.01); *G09G 3/3275* (2013.01);
(Continued)

(58) Field of Classification Search
CPC ...... G09G 3/32; G09G 3/3225; G09G 3/3266; G09G 3/3275; G09G 2300/0426;
(Continued)

(56) References Cited

U.S. PATENT DOCUMENTS

| 9,330,596 B2 * | 5/2016 | Choi | .................... G09G 3/3233 |
| 2007/0040772 A1 * | 2/2007 | Kim | ..................... G09G 3/3233 345/76 |

(Continued)

FOREIGN PATENT DOCUMENTS

| KR | 10-1791664 | 11/2017 |
| KR | 10-2018-0004382 | 1/2018 |
| KR | 10-2019-0079828 | 7/2019 |

*Primary Examiner* — Pegeman Karimi
(74) *Attorney, Agent, or Firm* — Kile Park Reed & Houtteman PLLC

(57) ABSTRACT

A pixel includes an organic light-emitting diode; a first transistor that receives a signal in response to a voltage applied to a first node and controls an amount of current flowing from a second node electrically connected to a power supply voltage line to the organic light-emitting diode; a fourth transistor electrically connected between the first node and a first initializing voltage line; and a bias capacitor electrically connected between the second node and a light-emission control line, the bias capacitor including a first capacitor electrode and a second capacitor electrode. The first capacitor electrode of the bias capacitor and a semiconductor layer of the first transistor are disposed on a same layer, and the second capacitor electrode of the bias capacitor and a second portion included in a gate electrode of the fourth transistor are disposed on a same layer.

19 Claims, 13 Drawing Sheets

(51) Int. Cl.
*H01L 27/32* (2006.01)
*G09G 3/3266* (2016.01)
*G09G 3/3275* (2016.01)
*H01L 27/12* (2006.01)
*H01L 29/786* (2006.01)

(52) U.S. Cl.
CPC ...... *H01L 27/3262* (2013.01); *H01L 27/3265* (2013.01); *H01L 27/3276* (2013.01); *G09G 2300/0426* (2013.01); *G09G 2320/0626* (2013.01); *H01L 27/124* (2013.01); *H01L 27/1225* (2013.01); *H01L 27/1255* (2013.01); *H01L 29/7869* (2013.01); *H01L 29/78675* (2013.01)

(58) Field of Classification Search
CPC ........... G09G 2320/0626; G09G 3/035; G09G 2330/021; G09G 3/30; G09G 3/34; G09G 3/36; H01L 27/3262; H01L 27/3265; H01L 27/3276; H01L 27/1225; H01L 27/124; H01L 27/32; H01L 29/78675; H01L 27/3279; H01L 2251/5338
See application file for complete search history.

(56) References Cited

U.S. PATENT DOCUMENTS

| | | | |
|---|---|---|---|
| 2011/0221791 A1* | 9/2011 | Kajiyama | G09G 3/3233 345/690 |
| 2014/0022152 A1* | 1/2014 | Guo | G09G 3/3233 345/82 |
| 2018/0006105 A1 | 1/2018 | Kim et al. | |
| 2018/0158410 A1 | 6/2018 | Jeon | |
| 2019/0164498 A1* | 5/2019 | Jang | G09G 3/3266 |

* cited by examiner

PIXEL, AND ORGANIC LIGHT-EMITTING DISPLAY DEVICE COMPRISING THE SAME

CROSS-REFERENCE TO RELATED APPLICATION(S)

This application claims priority to and benefits of Korean Patent Application No. 10-2020-0052883 under 35 U.S.C. § 119, filed on Apr. 29, 2020, in the Korean Intellectual Property Office, the entire contents of which are incorporated herein by reference.

BACKGROUND

1. Technical Field

One or more embodiments relate to a pixel and an organic light-emitting display device including the same, and, to a pixel capable of realizing a high-resolution display that enables high-quality image display, and an organic light-emitting display device including the pixel.

2. Description of the Related Art

In general, display devices include pixels, each of the pixels including a display element and a pixel circuit for controlling the display element. The pixel circuit may include a thin-film transistor (TFT), a storage capacitor, and lines.

To accurately control whether the display element emits light or not and the degree of light-emission of the display element, the number of transistors electrically connected to a single display element has been increased.

However, these conventional display devices are not easy to display high-quality images.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

One or more embodiments include a pixel capable of realizing high-resolution display that enables high-quality image display, and an organic light-emitting display device including the pixel. However, the one or more embodiments are only examples, and the scope of the disclosure is not limited thereto.

Additional aspects will be set forth in part in the description which follows and, in part, will be apparent from the description, or may be learned by practice of the presented embodiments of the disclosure.

According to one or more embodiments, a pixel may include an organic light-emitting diode; a first transistor that receives a signal in response to a voltage applied to a first node and controls an amount of current flowing from a second node electrically connected to a power supply voltage line to the organic light-emitting diode; a fourth transistor electrically connected between the first node and a first initializing voltage line; and a bias capacitor electrically connected between the second node and a light-emission control line. The bias capacitor may include a first capacitor electrode and a second capacitor electrode. The first capacitor electrode of the bias capacitor and a semiconductor layer of the first transistor may be disposed on a same layer, and the second capacitor electrode of the bias capacitor and a second portion included in a gate electrode of the fourth transistor may be disposed on a same layer.

The pixel may further include a second transistor electrically connected between the second node and a data line and turned on by a scan signal, and the second capacitor electrode may be disposed above a layer that overlaps a gate electrode of the second transistor.

The gate electrode of the fourth transistor may include a first portion located below the second portion, and the first portion and a gate electrode of the first transistor may be disposed on a same layer.

The gate electrode of the first transistor may be disposed over the semiconductor layer of the first transistor, and the first portion may be disposed on a layer that that overlaps the gate electrode of the first transistor.

The gate electrode of the first transistor may be disposed over the semiconductor layer of the first transistor. The first portion may be located on a layer that overlaps the gate electrode of the first transistor. A semiconductor layer of the fourth transistor may be disposed over the first portion. The second capacitor electrode may be disposed on a layer that overlaps the semiconductor layer of the fourth transistor.

The semiconductor layer of the first transistor may include a silicon semiconductor, and the semiconductor layer of the fourth transistor may include an oxide semiconductor.

The pixel may further include a sixth transistor electrically connected between the first transistor and the organic light-emitting diode and turned on by a light-emission control signal applied to the light-emission control line.

The pixel may further include a seventh transistor electrically connected between the sixth transistor and a second initializing voltage line, and the second capacitor electrode and a fourth portion included in a gate electrode of the seventh transistor may be integrally formed as a single body.

The gate electrode of the seventh transistor may include a third portion located below the fourth portion, the third portion and the gate electrode of the first transistor may be disposed on a same layer. The gate electrode of the first transistor may be disposed over the semiconductor layer of the first transistor, the third portion may be located on a layer that overlaps the gate electrode of the first transistor, a semiconductor layer of the seventh transistor may be disposed over the third portion, and the second capacitor electrode may be disposed on a layer that overlaps the semiconductor layer of the seventh transistor.

The pixel may further include a storage capacitor electrically connected between the first node and the power supply voltage line, wherein a third capacitor electrode of the storage capacitor and a first gate electrode of the first transistor may be integrally formed as a single body, a fourth capacitor electrode of the storage capacitor may be disposed above the third capacitor electrode, and the second capacitor electrode may be disposed on a layer that overlaps the fourth capacitor electrode, and a portion of the second capacitor electrode may overlap a portion of the fourth capacitor electrode.

According to one or more embodiments, an organic light-emitting display device may include a substrate; a first active layer disposed over the substrate and including a first source region; a first active region adjacent to the first source region; a first drain region adjacent to the first active region; and a first capacitor electrode electrically connected to the first source region; a first gate layer including a first gate electrode disposed above the first active region; a third gate layer including a second capacitor electrode disposed above the first capacitor electrode; and an organic light-emitting diode, wherein current may flow from the first active region to the first drain region in response to a voltage applied to the first gate electrode to control brightness of the organic-light emitting diode.

The first active layer may include a second source region adjacent to the first active region; a second drain region electrically connected to the first source region; and a second active region adjacent to the second drain region, and the first gate layer may include a second gate electrode which is a part of a scan line that overlaps the second active region.

The organic light-emitting display device may further include a second gate layer comprising a $4\text{-}1^{st}$ gate electrode which is a part of a lower initializing line and disposed on a layer overlapping the first gate layer; and a second active layer disposed on a layer overlapping the second gate layer. The second active layer may comprise a fourth active region that overlaps the $4\text{-}1^{st}$ gate electrode. The third gate layer may be disposed on a layer overlapping the second active layer, and may include a $4\text{-}2^{nd}$ gate electrode which is a part of an upper initializing line and overlaps the fourth active region.

The first active layer may include a silicon semiconductor, and the second active layer may include an oxide semiconductor.

The first active layer may include a sixth source region electrically connected to the first drain region; a sixth active region adjacent to the sixth source region; and a sixth drain region adjacent to the sixth active region. The first gate layer may further include a sixth gate electrode overlapping the sixth active region, the sixth gate electrode being a part of a lower light-emission control line included in a light-emission control line, and a pixel electrode of the organic light-emitting diode may be electrically connected to the sixth drain region.

The second active layer may include a seventh active region, the first gate layer may include a $7\text{-}1^{st}$ gate electrode which is a part of the lower light-emission control line and overlaps the seventh active region, the third gate layer may include a $7\text{-}2^{nd}$ gate electrode overlapping the seventh active region, the $7\text{-}2^{nd}$ gate electrode may be a part of an upper light-emission control line included in the light-emission control line, and the $7\text{-}2^{nd}$ gate electrode and the second capacitor electrode may be integrally formed as a single body.

The organic light-emitting display device may further include a third capacitor electrode, the third capacitor electrode and the first gate electrode being integrally formed as a single body, wherein the second gate layer may include a fourth capacitor electrode overlapping the third capacitor electrode and electrically connected to a power supply voltage line.

A portion of the second capacitor electrode may overlap a portion of the fourth capacitor electrode.

The first source region and the first capacitor electrode may be integrally formed as a single body.

These and/or other aspects will become apparent and more readily appreciated from the following description of the embodiments, the claims, and the accompanying drawings.

BRIEF DESCRIPTION OF THE DRAWINGS

The above and other aspects, features, and advantages of embodiments of the disclosure will be more apparent from the following description taken in conjunction with the accompanying drawings, in which.

DETAILED DESCRIPTION OF THE EMBODIMENTS

Figure 1:
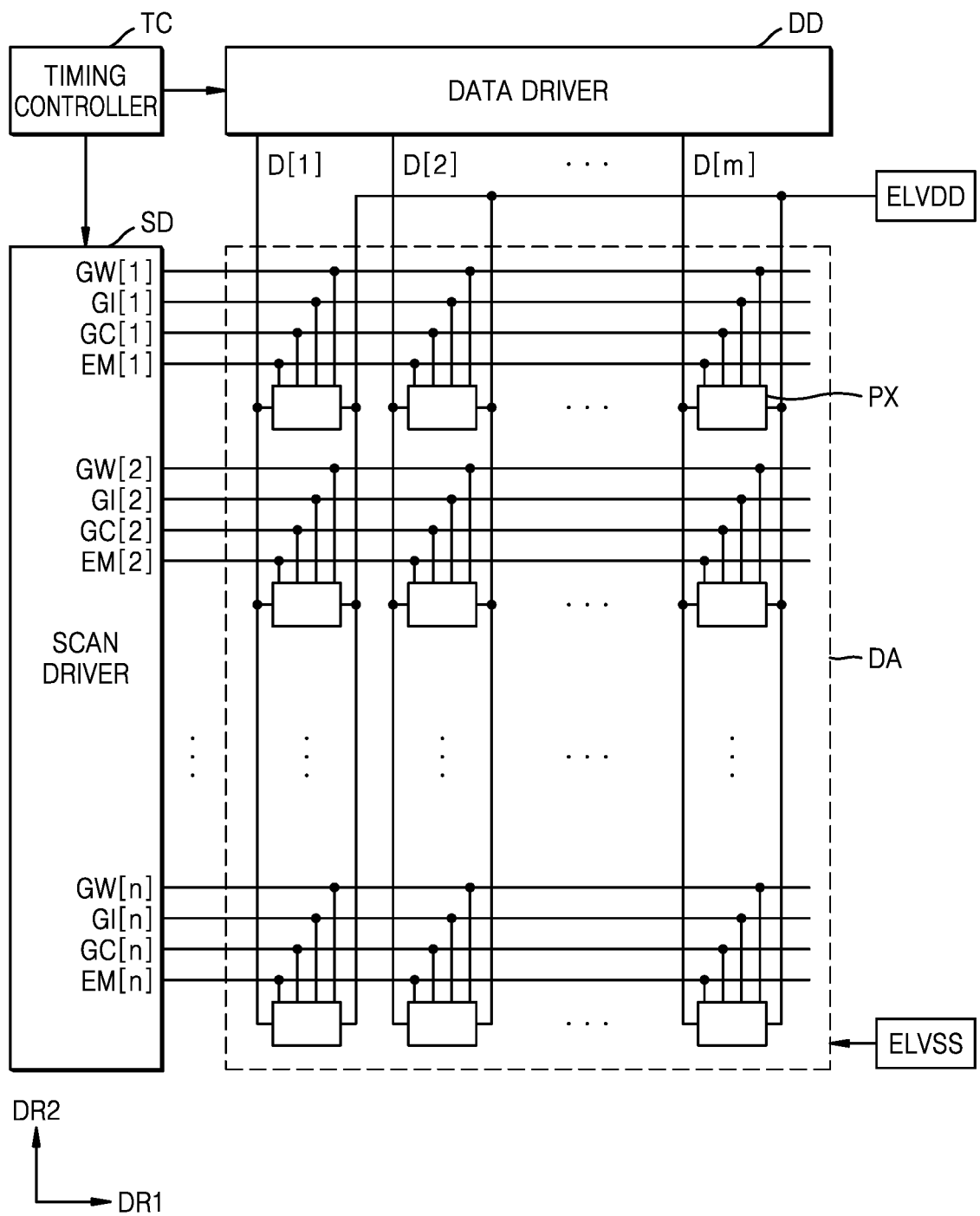
FIG. 1 is a schematic conceptual view of an organic light-emitting display device according to an embodiment.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, the embodiments are merely described below, by referring to the figures, to explain aspects of the description.

As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B."

As the disclosure allows for various changes and numerous embodiments, embodiments will be illustrated in the drawings and described in detail in the written description. Hereinafter, effects and features of the disclosure and a method for accomplishing them will be described more fully with reference to the accompanying drawings, in which embodiments of the disclosure are shown. This disclosure may, however, be embodied in many different forms and should not be construed as limited to the embodiments set forth herein.

One or more embodiments of the disclosure will be described below in more detail with reference to the accompanying drawings. Those components that are the same or are in correspondence with each other are rendered the same reference numeral regardless of the figure number, and redundant explanations may be omitted.

It will be understood that, unless otherwise specified, when an element such as a layer, film, region or substrate is referred to as being "on" another element, it may be "directly" on the other element or intervening elements may also be present. In the drawings, the thicknesses of layers and regions are exaggerated or minimized for convenience of explanation. In other words, since sizes and thicknesses of components in the drawings are arbitrarily illustrated for convenience of explanation, the following embodiments are not limited thereto.

It will be understood that although the terms "first," "second," etc. may be used herein to describe various components, these components should not be limited by these terms. These components are only used to distinguish one component from another. For example, a first element referred to as a first element in one embodiment may be referred to as a second element in another embodiment without departing from the scope of the appended claims.

As used herein, the singular forms "a," "an," and "the" are intended to include the plural forms as well, unless the context clearly indicates otherwise.

It will be further understood that the terms "comprises" and/or "comprising", "includes" and/or "including", "have" and/or "having" used herein specify the presence of stated features or components, but do not preclude the presence or addition of one or more other features or components.

Further when a layer, film, region, substrate, or area, or element, is referred to as being "below" another layer, film, region, substrate, or area, or element, it may be directly below the other layer, film, region, substrate, or area, or element, or intervening layers, films, regions, substrates, or areas, or elements, may be present therebetween. Conversely, when a layer, film, region, substrate, or area, or element, is referred to as being "directly below" another layer, film, region, substrate, or area, or element, intervening layers, films, regions, substrates, or areas, or elements may be absent therebetween. Further, "over" or "on" may include positioning on or below an object and does not necessarily imply a direction based upon gravity.

It will be understood that when a layer, region, or component is referred to as being "connected" to another layer, region, or component, it may be "directly connected" to the other layer, region, or component and/or may be "indirectly connected" to the other layer, region, or component with other layer, region, or component interposed therebetween. For example, it will be understood that when a layer, region, or component is referred to as being "electrically connected" to another layer, region, or component, it may be "directly electrically connected" to the other layer, region, or component and/or may be "indirectly electrically connected" to other layer, region, or component with other layer, region, or component interposed therebetween.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

Additionally, the terms "overlap" or "overlapped" mean that a first object may be above or below or to a side of a second object, and vice versa. Additionally, the term "overlap" may include layer, stack, face or facing, extending over, covering or partly covering or any other suitable term as would be appreciated and understood by those of ordinary skill in the art. The terms "face" and "facing" mean that a first element may directly or indirectly oppose a second element. In a case in which a third element intervenes between the first and second element, the first and second element may be understood as being indirectly opposed to one another, although still facing each other. When an element is described as 'not overlapping' or 'to not overlap' another element, this may include that the elements are spaced apart from each other, offset from each other, or set aside from each other or any other suitable term as would be appreciated and understood by those of ordinary skill in the art.

In embodiments below, when a component is referred to as being "on a plane," it is understood that a component is viewed from the top, and when a component is referred to as being "on a schematic cross section," it is understood that the component is vertically cut and viewed from the side.

Also, when an element is referred to as being "in contact" or "contacted" or the like to another element, the element may be in "electrical contact" or in "physical contact" with another element; or in "indirect contact" or in "direct contact" with another element.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

In the following embodiments, the meaning that a wire extends in a first direction or a second direction encompasses not only extending in a straight line but also extending in zigzags or in a curve in the first direction or the second direction.

In the following embodiments, when referred to "planar", it means when an object is viewed from above, and when referred to "sectional", it means when a cross section formed by vertically cutting an object is viewed from the side. In the following embodiments, a first component "overlapping" a second component refers to the first component being located above or below the second component.

Unless otherwise defined, all terms (including technical and scientific terms) used herein have the same meaning as commonly understood by one of ordinary skill in the art to which embodiments pertain. In addition, it will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a schematic conceptual view of an organic light-emitting display device according to an embodiment.

The organic light-emitting display device according to an embodiment may be implemented as an electronic device such as a smartphone, a mobile phone, a navigation device, a game player, a TV, a vehicle head unit, a notebook computer, a laptop computer, a tablet computer, a personal media player (PMP), or personal digital assistants (PDAs). The electronic device may be a flexible device.

The organic light-emitting display device according to an embodiment may include a display area DA including pixels PX, a scan driver SD, a data driver DD, and a timing controller TC for controlling the scan driver SD and the data driver DD.

The scan driver SD may supply scan signals GW[1] through GW[n], initialization signals GI[1] through GI[n], compensating control signals GC[1] through GC[n], and light-emission control signals EM[1] through EM[n] to scan lines each extending in a first direction DR1, under the control of the timing controller TC. For example, the scan driver SD may sequentially supply the scan signals GW[1] through GW[n], the initialization signals GI[1] through GI[n], the compensating control signals GC[1] through GC[n], and the light-emission control signals EM[1] through EM[n] to scan lines, initializing lines, compensating control lines, and light-emission control lines, respectively.

Each of the scan signals GW[1] through GW[n], the initialization signals GI[1] through GI[n], the compensating control signals GC[1] through GC[n], and the light-emission control signals EM[1] through EM[n] may be a high-voltage or low-voltage signal. Each transistor may be turned on when a high voltage is applied and may be turned off when a low voltage is applied, or may be turned off when a high voltage is applied and may be turned on when a low voltage is applied, according to characteristics of the transistor.

The data driver DD may supply data signals D[1] through D[m] to data lines each extending in a second direction DR2, under the control of the timing controller TC. The data driver DD may supply the data signals D[1] through D[m] such that the data signals D[1] through D[m] may be synchronized with the scan signals GW[1] through GW[n], and accordingly, the data signals D[1] through D[m] may be supplied to pixels PX selected due to the scan signals GW[l] through GW[n].

The timing controller TC may control the scan driver SD and the data driver DD in response to externally provided synchronization signals.

A power supply voltage ELVDD and an electrode voltage ELVSS may be supplied to the pixels PX within the display area DA. In response to the power supply voltage ELVDD and the electrode voltage ELVSS, the pixels PX may control the amount of current flowing from a power supply voltage line to an electrode power line via an organic light-emitting diode in correspondence with the data signals D[1] through D[m], thereby generating light having brightness corresponding to the data signals D[1] through D[m]. The power supply voltage ELVDD may be applied to the power supply voltage line, and the electrode voltage ELVSS may be applied to the electrode power line.

Although the pixels PX may be sequentially arranged or disposed in the first direction DR1 and the second direction DR2 within the display area DA in FIG. 1, embodiments are not limited thereto. For example, the pixels PX may be arranged or disposed in various configurations such as a PenTile® configuration and a mosaic configuration, other than a stripe configuration. The display area DA may have a substantially rectangular shape in a plan view as shown in FIG. 1. However, the display area DA may have the shape substantially of a polygon (such as a triangle, a pentagon, or a hexagon), or a circular, oval, or irregular shape.

Figure 2:
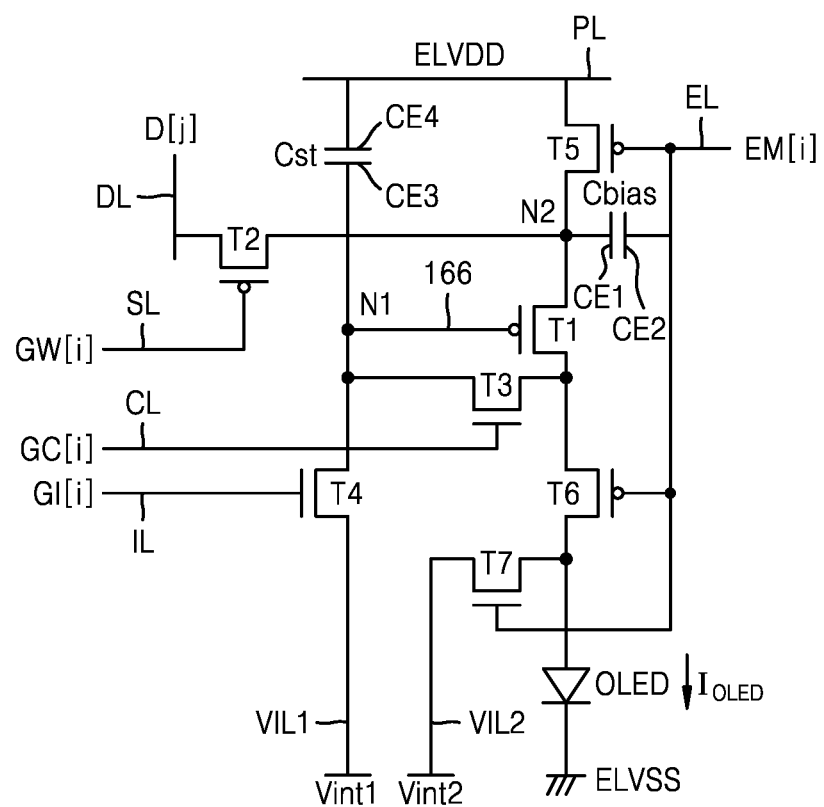
FIG. 2 is an equivalent circuit diagram of a pixel included in the display device of FIG. 1.

FIG. 2 is an equivalent circuit diagram of a pixel PX included in the display device of FIG. 1.

Referring to FIG. 2, the pixel PX may include first, second, third, fourth, fifth, sixth, and seventh transistors T1, T2, T3, T4, T5, T6, and T7, a bias capacitor Cbias, a storage capacitor Cst, an organic light-emitting diode OLED, a first initializing voltage line VIL1, a second initializing voltage line VIL2, a power supply voltage line PL, and signal lines. The signal lines may include a data line DL, a scan line SL, an initializing line IL, a compensating control line CL, and a light-emission control line EL. At least one of the signal lines, the first initializing voltage line VIL1, the second initializing voltage line VIL2, and/or the power supply voltage line PL may be shared by neighboring or adjacent pixels.

The power supply voltage line PL may transmit the power supply voltage ELVDD to the first transistor T1. The first initializing voltage line VIL1 may transmit, to the pixel PX, a first initializing voltage Vint1 that may initialize the first transistor T1. The second initializing voltage line VIL2 may transmit, to the pixel PX, a second initializing voltage Vint2 that may initialize the organic light-emitting diode OLED. For example, the first initializing voltage Vint1 may be about −5V, and the second initializing voltage Vint2 may be in a range of about −7V to about −6V. Thus, the first initializing voltage Vint1 may be higher than the second initializing voltage Vint2.

The scan line SL, the initializing line IL, the compensating control line CL, the light-emission control line EL, the first initializing voltage line VIL1, and the second initializing voltage line VIL2 may each extend in the first direction DR1 and may be arranged or disposed on respective rows to be spaced apart from each other. The data line DL and the power supply voltage line PL may each extend in the second direction DR2 and may be arranged or disposed on respective columns to be spaced apart from each other.

In FIG. 2, the third transistor T3, the fourth transistor T4, and the seventh transistor T7 from among the first, second, third, fourth, fifth, sixth, and seventh transistors T1, T2, T3, T4, T5, T6, and T7 may be implemented as n-channel MOSFETs (NMOS), and the remaining ones may be implemented as p-channel MOSFETs (PMOS).

The first transistor T1 may be electrically connected to the power supply voltage line PL through the fifth transistor T5, and may be electrically connected to the organic light-emitting diode OLED via the sixth transistor T6. The first transistor T1 may be a driving transistor, and may receive a data signal D[j] according to a voltage applied to a first node N1 and may control the amount of driving current $I_{OLED}$ flowing from a second node N2 electrically connected to the power supply voltage line PL to the electrode power line via the organic light-emitting diode OLED.

The second transistor T2 may be electrically connected to the scan line SL and the data line DL, and may be electrically connected to the power supply voltage line PL via the fifth transistor T5. The second transistor T2, which may be on an i-th row among a total of n rows, may be turned on according to a scan signal GW[i] received via the scan line SL, and thus may perform a switching operation of transmitting the data signal D[j] received via the data line DL, which may be on a j-th column among a total of m columns, to the second node N2. In other words, the second transistor T2 may be a switching transistor. Herein, i is a natural number in the range of 1 to n, and j is a natural number in the range of 1 to m. For example, the second transistor T2 may be turned on according to a low-voltage scan signal GW[i].

The third transistor T3 may be a compensating transistor, and may be electrically connected to the compensating control line CL and may be electrically connected to the organic light-emitting diode OLED via the sixth transistor T6. The third transistor T3 may be turned on according to a compensating control signal GC[i] received via the compensating control line CL and thus diode-connects the first transistor T1. For example, the third transistor T3 may be turned on according to a compensating control signal GC[i] of a high voltage.

The fourth transistor T4 may be a first initializing transistor, and may be electrically connected to the initializing line IL and the first initializing voltage line VIL1, may be turned on according to an initialization signal GI[i] received via the initializing line IL and thus may transmit the first initializing voltage Vint1 from the first initializing voltage line VIL1 to a first gate electrode of the first transistor T1 to thereby initialize the voltage of the first gate electrode of the first transistor T1. For example, the fourth transistor T4 may be turned on according to an initializing signal GI[i] of a high voltage.

The fifth transistor T5 and the sixth transistor T6 may be electrically connected to the light-emission control line EL, and may be simultaneously turned on according to a light-emission control signal EM[i] received through the light-emission control line EL and thus may form a current path so that the driving current $I_{OLED}$ may flow from the power supply voltage line PL to the organic light-emitting diode OLED. For example, the fifth transistor T5 and the sixth transistor T6 may be turned on according to a light-emission control signal EM[i] of a low voltage. The fifth transistor T5 may be an operation control transistor, and the sixth transistor T6 may be a light-emission control transistor.

The seventh transistor T7 may be a second initializing transistor, and may be electrically connected to the light-emission control line EL and the second initializing voltage line VIL2, may be turned on according to a light-emission control signal EM[i] received via the light-emission control line EL and thus may transmit the second initializing voltage Vint2 from the second initializing voltage line VIL2 to the organic light-emitting diode OLED to thereby initialize the organic light-emitting diode OLED. For example, the seventh transistor T7 may be turned on according to a light-emission control signal EM[i] of a high voltage. The seventh transistor T7 may be omitted.

The storage capacitor Cst may include a third capacitor electrode CE3 and a fourth capacitor electrode CE4. The third capacitor electrode CE3 may be electrically connected to the first gate electrode of the first transistor T1, and the fourth capacitor electrode CE4 may be electrically connected to the power supply voltage line PL. The storage capacitor Cst may maintain a voltage applied to the first gate electrode of the first transistor T1, by storing and maintaining a voltage corresponding to a difference between the voltage of the power supply voltage line PL and the voltage of the first gate electrode of the first transistor T1.

The bias capacitor Cbias electrically connected between the second node N2 and the light-emission control line EL may include a first capacitor electrode CE1 and a second capacitor electrode CE2. The first capacitor electrode CE1 may be electrically connected to the power supply voltage line PL via the fifth transistor T5, and the second capacitor electrode CE2 may be electrically connected to the light-emission control line EL. When a light-emission control signal of a high voltage is applied by the light-emission control line EL, the fifth transistor T5 and the sixth transistor T6 respectively having gate electrodes electrically connected to the light-emission control line EL may be turned off. When an initialization signal of a low voltage is applied by the initializing line IL, the fourth transistor T4 of which a gate electrode may be electrically connected to the initializing line IL may be turned off. Thus, the first transistor T1 may enter an on bias state and may be initialized.

The first initializing voltage Vint1 may be about −5V, and the second initializing voltage Vint2 may be in a range of about −7V to about −6V. As such, the first initializing voltage Vint1 may be higher than the second initializing voltage Vint2. Accordingly, when the first transistor T1 enters an on bias state, a data voltage of a current frame that may be input later may always be lower than an on bias voltage and thus may not be related to the magnitude of a voltage of a previous frame. Accordingly, a hysteresis issue and a step efficiency issue may not be generated, or generation rates thereof may be minimized. By reference, the hysteresis issue refers to an issue in which a gate-source voltage versus source-drain current curve of the first transistor T1 when the data voltage of a current frame may be higher than that of a previous frame becomes different from a gate-source voltage versus source-drain current curve of the first transistor T1 when the data voltage of the current frame may be lower than that of the previous frame. The step efficiency issue refers to an issue in which, when a grayscale is rapidly changed in units of frames, for example, when a grayscale in a previous frame may be black but a grayscale in a current frame may be white, a pixel may have a brightness corresponding to an intermediate grayscale other than a desired grayscale due to a change in the above-described voltage versus current curve.

The organic light-emitting diode OLED may include a pixel electrode, an opposite electrode, and an intermediate layer interposed therebetween and including an emission layer. In pixels in plural, the electrode voltage ELVSS may be applied to an integrally formed opposite electrode. The organic light-emitting diode OLED may receive the driving current $I_{OLED}$ from the first transistor T1 and emit light, so that the display device may display an image. By reference, the opposite electrode may extend to the outside of the display area and may be electrically connected to the electrode power line, and the electrode voltage ELVSS may be applied to the electrode power line.

Figure 3:
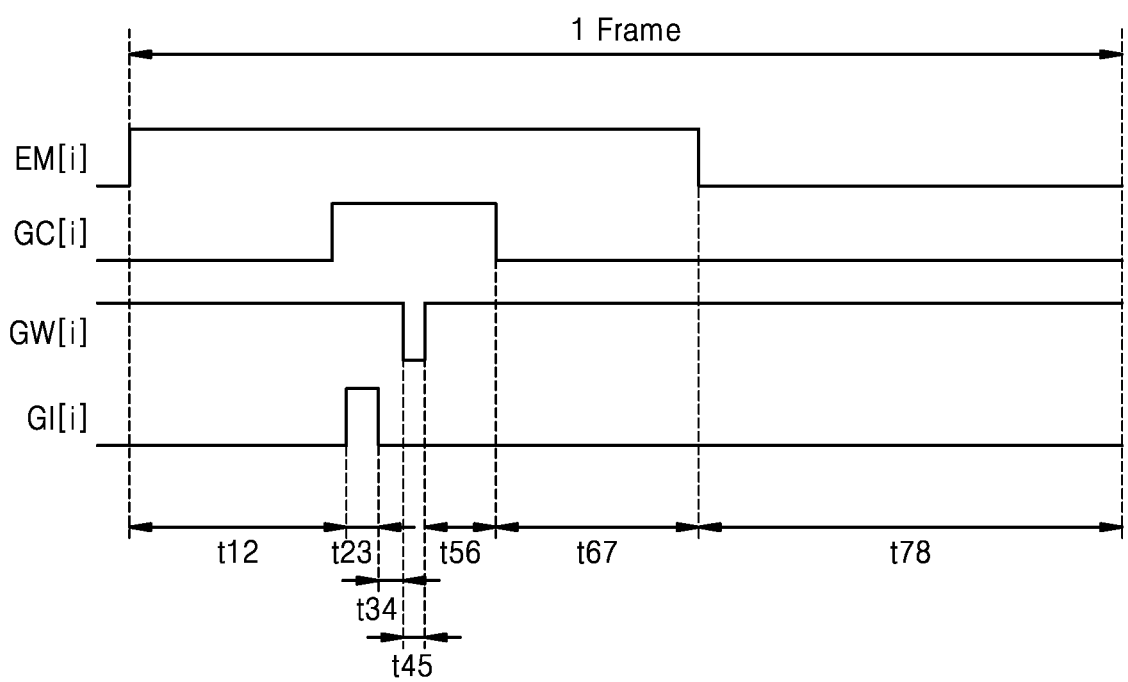
FIG. 3 is a waveform diagram illustrating a driving method of the equivalent circuit diagram of FIG. 2.

A detailed operation of each pixel PX according to an embodiment will now be described with reference to FIG. 3, which is a waveform diagram illustrating a driving method of the equivalent circuit diagram of FIG. 2.

First, during a time period t12, the light-emission control signal EM[i] of a high voltage, the compensating control signal GC[i] of a low voltage, the scan signal GW[i] of a high voltage, and the initialization signal GI[i] of a low voltage may be applied to the pixels on the i-th row via the light-emission control line EL, the compensating control line CL, the scan line SL, and the initializing line IL, respectively. Accordingly, the second through sixth transistors T2 through T6 may be turned off, and thus the first transistor T1 may enter an on bias state by the bias capacitor Cbias and may be initialized. At this time, the seventh transistor T7 may be turned on to make a current flow along the second initializing voltage line VIL2 instead of flowing to the organic light-emitting diode OLED. Thus, the organic light-emitting diode OLED may be initialized.

Then, during a time period t23, the compensating control signal GC[i] and the initialization signal GI[i] may be changed to a high voltage. Accordingly, the third transistor T3 and the fourth transistor T4 may be turned on, and the voltage of the first gate electrode of the first transistor T1 may be initialized by the first initializing voltage Vint1 supplied from the first initializing voltage line VIL1.

During a time period t34, the initialization signal GI[i] may be changed to a low voltage and thus the fourth transistor T4 may be turned off. Then, during a time period t45, the scan signal GW[i] may be changed to a low voltage and thus the second transistor T2 may be turned on. Accordingly, during the time period t45, a voltage corresponding to the data signal D[j] supplied from the data line DL may be applied to the second node N2. Then, during a time period t56, the scan signal GW[i] may be changed to a high voltage and thus the second transistor T2 may be turned off. Because the third transistor T3 may maintain a turned-on state, the first transistor T1 may be diode-connected by the third transistor T3 and biased in a forward direction. Consequently, a voltage in which a threshold voltage Vth of the first transistor T1 has been compensated for in the data signal D[j] supplied from the data line DL may be applied to the first gate electrode of the first transistor T1, namely, to the first node N1. Accordingly, the power supply voltage ELVDD and a compensating voltage may be applied to both ends of the storage capacitor Cst, and a charge corresponding to a voltage difference between both ends may be stored in the storage capacitor Cst.

Thereafter, during a time period t67, the compensating control signal GC[i] may be changed to a low voltage and thus the third transistor T3 may be turned off. During a time period t78, the light-emission control signal EM[i] may be changed to a low voltage and thus the seventh transistor T7 may be turned off and the fifth transistor T5 and the sixth transistor T6 may be turned on, and thus the driving current $I_{OLED}$ due to a voltage difference between the voltage of the first gate electrode of the first transistor T1 and the power supply voltage ELVDD may be generated, and may be provided to the organic light-emitting diode OLED via the sixth transistor T6 and thus the organic light-emitting diode OLED may emit light.

According to an embodiment, at least one of the first, second, third, fourth, fifth, sixth, and seventh transistors T1, T2, T3, T4, T5, T6, and T7 may include a semiconductor layer including an oxide, and the others may include a semiconductor layer including silicon. In detail, the first transistor T1 directly affecting the brightness of the display device may include a semiconductor layer including polycrystalline silicon having high reliability, and thus a high-resolution display device may be realized.

Because an oxide semiconductor has high carrier mobility and a low leakage current, a voltage drop may not be big even when a driving time may be long. In other words, in the case of a thin-film transistor including an oxide semiconductor, a change in the color of an image due to a voltage drop may not be big even during low-frequency driving. Because an oxide semiconductor has a small leakage current, at least one of the third transistor T3 and the fourth transistor T4 electrically connected to the first gate electrode of the first transistor T1 may include an oxide semiconductor in order to prevent flowing of a leakage current to the first gate electrode of the first transistor T1 and also reduce power consumption. Moreover, the seventh transistor T7 preventing flow of a current to the organic light-emitting diode OLED before light emission by the organic light-emitting diode OLED according to the light-emission control signal EM[i] starts may include an oxide semiconductor in order to prevent flow of a leakage current to the organic light-emitting diode OLED and also reduce power consumption.

Figure 4:
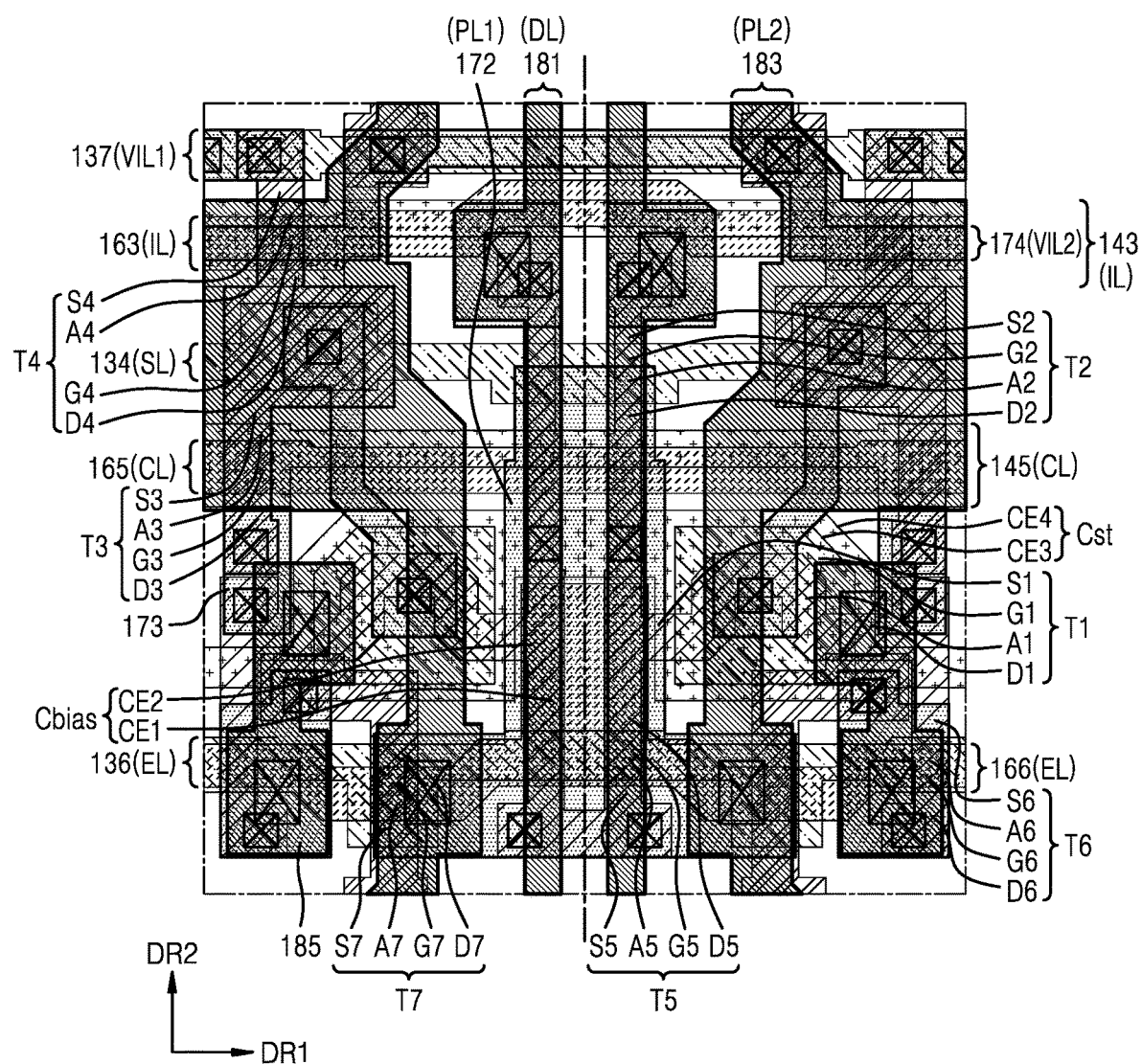
FIG. 4 is a layout diagram for schematically illustrating locations of transistors and capacitors in the pixel of FIG. 2.

FIG. 4 is a layout diagram for schematically showing locations of transistors and capacitors in the pixel PX of FIG. 2. FIG. 4 illustrates a pair of pixels PX arranged or disposed on the same row of adjacent columns. In FIG. 4, a pixel circuit of a pixel arranged or disposed in a left pixel region and a pixel circuit of a pixel arranged or disposed in a right pixel region may be bilaterally symmetrical to each other. By reference, for convenience of explanation, FIG. 4 does not illustrate the organic light-emitting diode OLED. In other words, FIG. 4 is a layout diagram for schematically showing the locations of the pixel circuits included in pixels.

FIGS. 5 through 11 are schematic layout diagrams for schematically showing components, such as the transistors and capacitors shown in FIG. 4, for each layer. As sequentially shown in FIGS. 5 through 11, a first active layer AL1 shown in FIG. 5, a first gate layer GL1 shown in FIG. 6, a second gate layer GL2 shown in FIG. 7, a second active layer AL2 shown in FIG. 8, a third gate layer GL3 shown in FIG. 9, a first source drain layer SDL1 shown in FIG. 10, and a second source drain layer SDL2 shown in FIG. 11 may be arranged or disposed in a direction away from the substrate.

Insulating layers may be interposed between these layers. In detail, a first gate insulating layer may be interposed between the first active layer AL1 shown in FIG. 5 and the first gate layer GL1 shown in FIG. 6, a second gate insulating layer may be interposed between the first gate layer GL1 shown in FIG. 6 and the second gate layer GL2 shown in FIG. 7, a third gate insulating layer may be interposed between the second gate layer GL2 shown in FIG. 7 and the second active layer AL2 shown in FIG. 8, a fourth gate insulating layer may be interposed between the second active layer AL2 shown in FIG. 8 and the third gate layer GL3 shown in FIG. 9, a first interlayer insulating layer may be interposed between the third gate layer GL3 shown in FIG. 9 and the first source drain layer SDL1 shown in FIG. 10, and a second interlayer insulating layer may be interposed between the first source drain layer SDL1 shown in FIG. 10 and the second source drain layer SDL2 shown in FIG. 11. These insulating layers may include silicon oxide, silicon nitride, silicon oxynitride, aluminum oxide, titanium oxide, tantalum oxide, hafnium oxide, and/or zinc oxide. Each of the insulating layers may have a single-layer structure or a multi-layer structure as within the spirit and the scope of the disclosure. The components of different layers may be electrically connected to each other through contact holes formed or disposed in the insulating layers.

Figure 5:
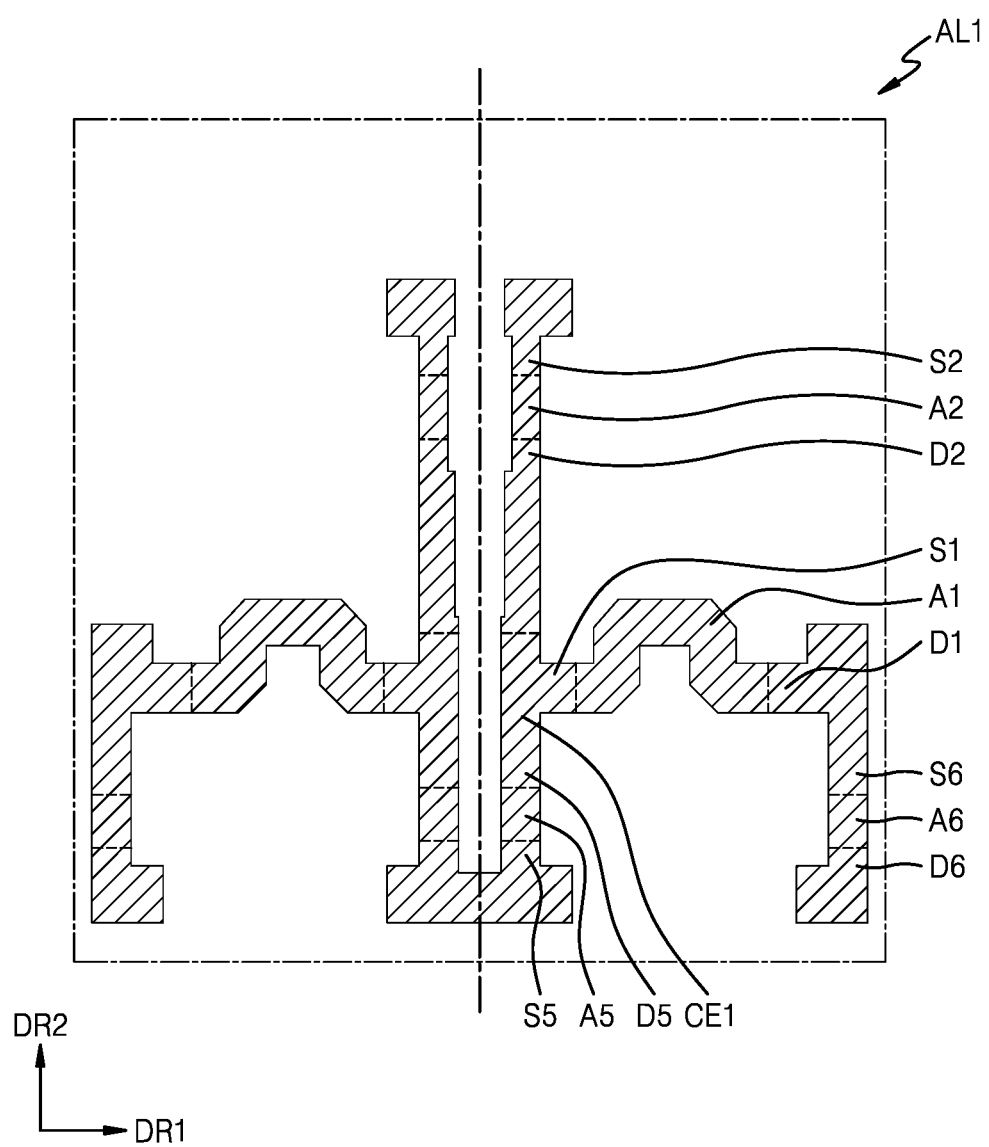
FIGS. 5 through 11 are schematic layout diagrams for schematically illustrating components, such as the transistors and capacitors of FIG. 4, for each layer.

The first active layer AL1 shown in FIG. 5 may be a semiconductor layer including polycrystalline silicon. The source regions and the drain regions of the first active layer AL1 may be doped with impurities that may include N-type impurities or P-type impurities. Each source region and each drain region may correspond to a source electrode and a drain electrode, respectively. A source region and a drain region may be interchanged with each other, according to the polarity of a transistor. Hereinafter, a source region and a drain region may be used instead of a source electrode and a drain electrode. In the equivalent circuit diagram of FIG. 2, specific or predetermined portions of the first active layer AL1 may be doped with P-type impurities, and thus the first transistor T1, the second transistor T2, the fifth transistor T5, and the sixth transistor T6 may be implemented as p-channel MOSFETs (PMOS). The other portions of the first active layer AL1 may also be doped with impurities, and thus may serve as lines that may electrically connect the transistors and/or the capacitors to each other or serve as a capacitor electrode and the like within the spirit and the scope of the disclosure.

The first active layer AL1 shown in FIG. 5 may be located or disposed on the substrate. The substrate may include glass, metal, or polymer resin. In a case that the substrate is flexible or bendable, the substrate may include polymer resin such as polyethersulphone, polyacrylate, polyetherimide, polyethylene naphthalate, polyethylene terephthalate, polyphenylene sulfide, polyarylate, polyimide, polycarbonate, or cellulose acetate propionate. The substrate may have a multi-layered structure including two layers including a polymer resin and a barrier layer including an inorganic material (silicon oxide, silicon nitride, silicon oxynitride, or the like) between the two layers. In this way, various modifications may be made.

Other layers may be disposed between the substrate and the first active layer AL1. For example, a buffer layer including one or more of a silicon nitride layer, a silicon oxynitride layer, a silicon oxide layer, a titanium oxide layer, and an aluminum oxide layer may be disposed between the substrate and the first active layer AL1. The buffer layer may increase a smoothness of an upper surface of the substrate or may prevent or minimize infiltration of impurities from the substrate and the like into the first active layer AL1. The buffer layer may have a single-layer structure or a multi-layer structure as within the spirit and the scope of the disclosure. In a multi-layer structure, some or a predetermined number of layers may be referred to as barrier layers.

Figure 6:
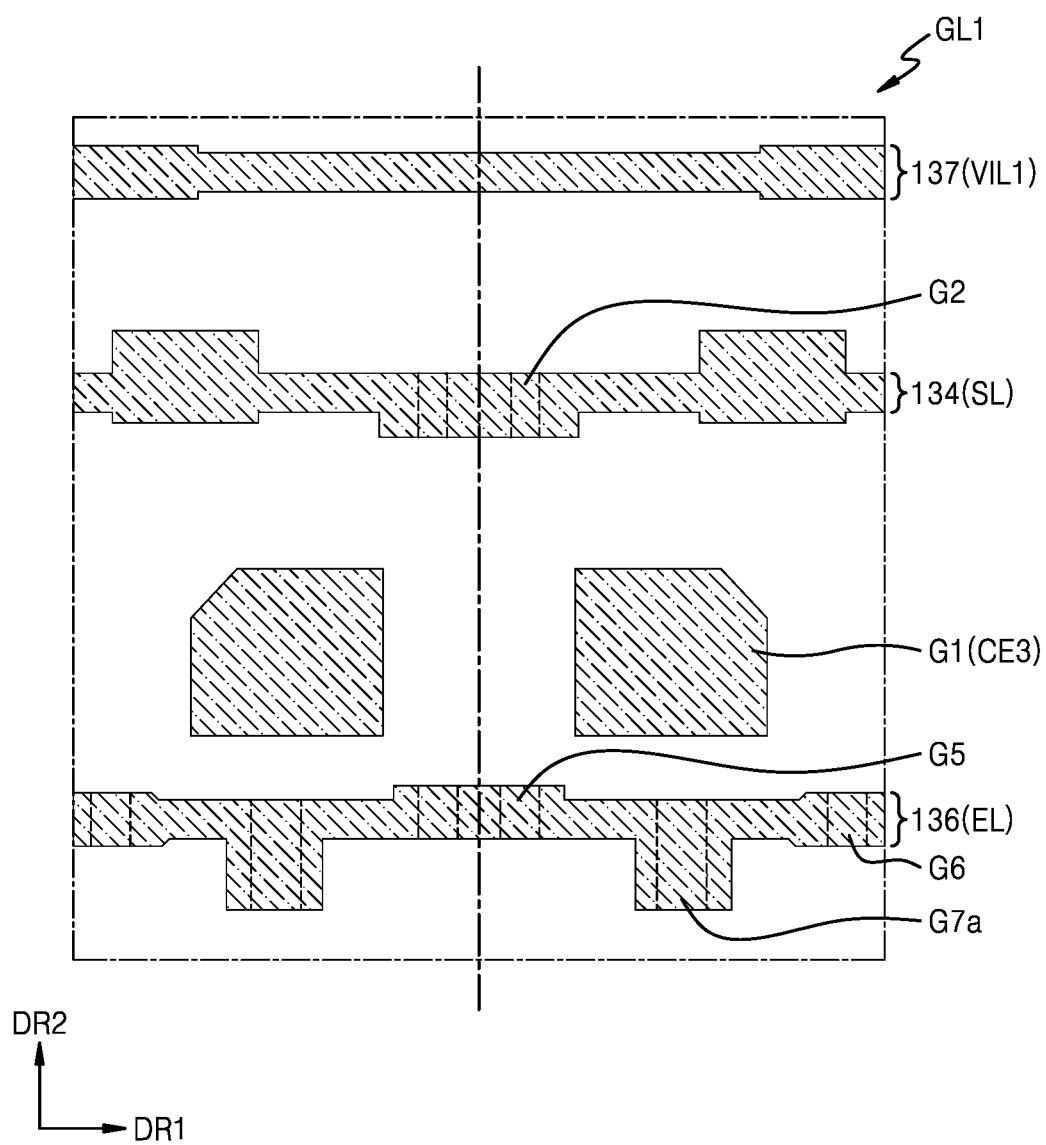
Figure 7:
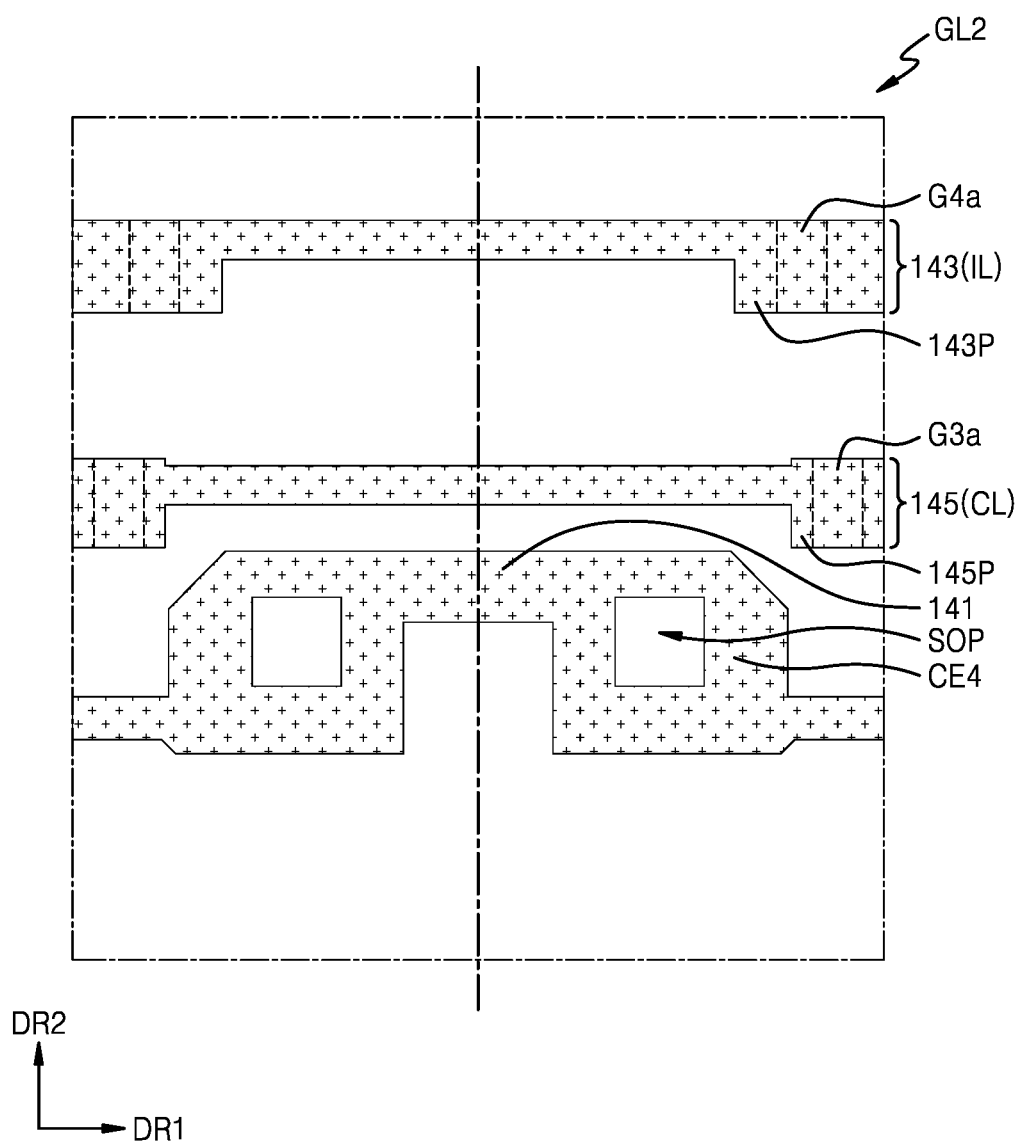
Figure 9:
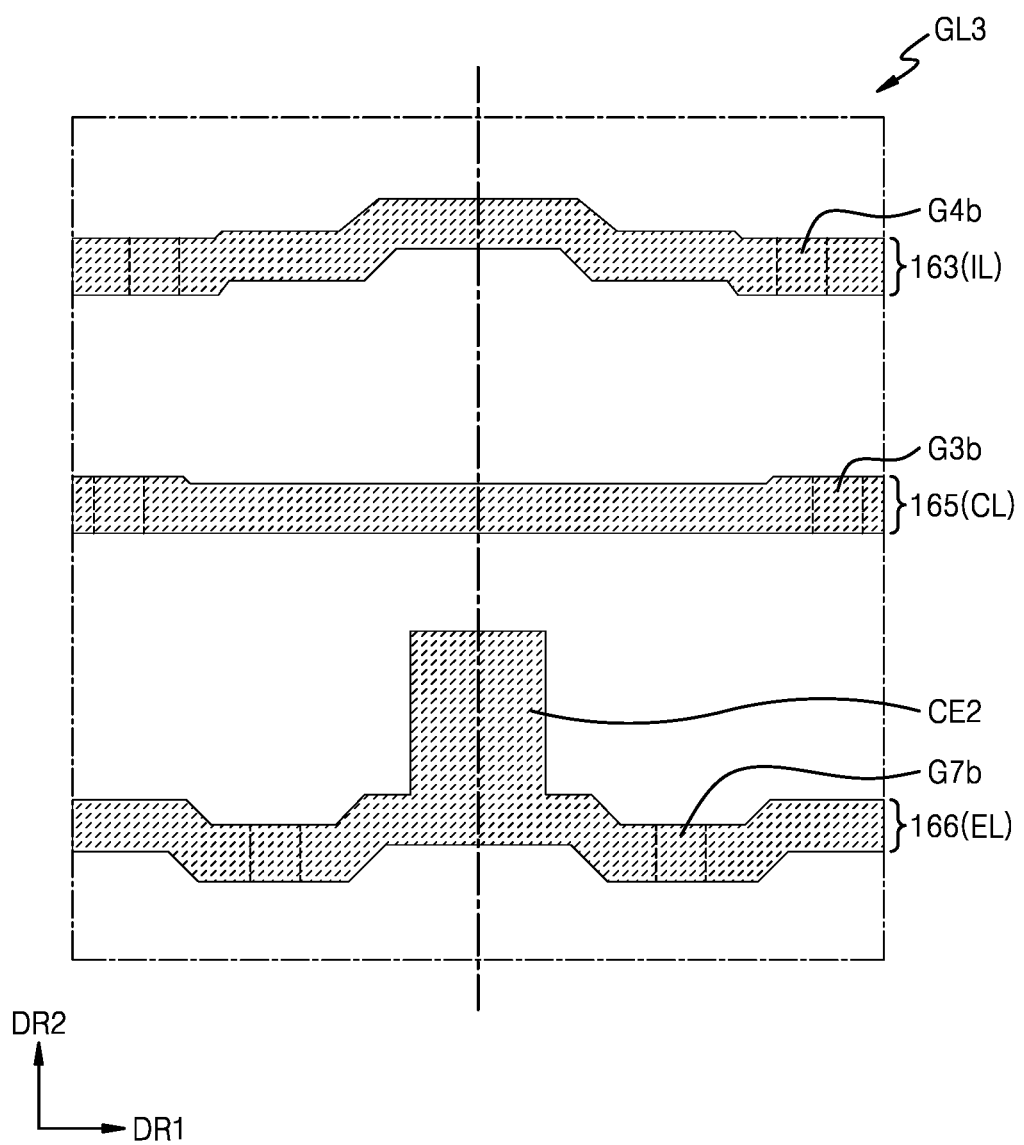

Each of the first gate layer GL1 shown in FIG. 6, the second gate layer GL2 shown in FIG. 7, and the third gate layer GL3 shown in FIG. 9 may include aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and/or copper (Cu). Each of these layers may have a single-layer structure or a multi-layer structure. When each of these layers has a multi-layered structure, it may include several materials. For example, each of the first gate layer GL1 shown in FIG. 6, the second gate layer GL2 shown in FIG. 7, and the third gate layer GL3 shown in FIG. 9 may have a two-layered structure of Mo layer/Al layer or may have a three-layered structure of Mo layer/Al layer/Mo layer.

Figure 8:
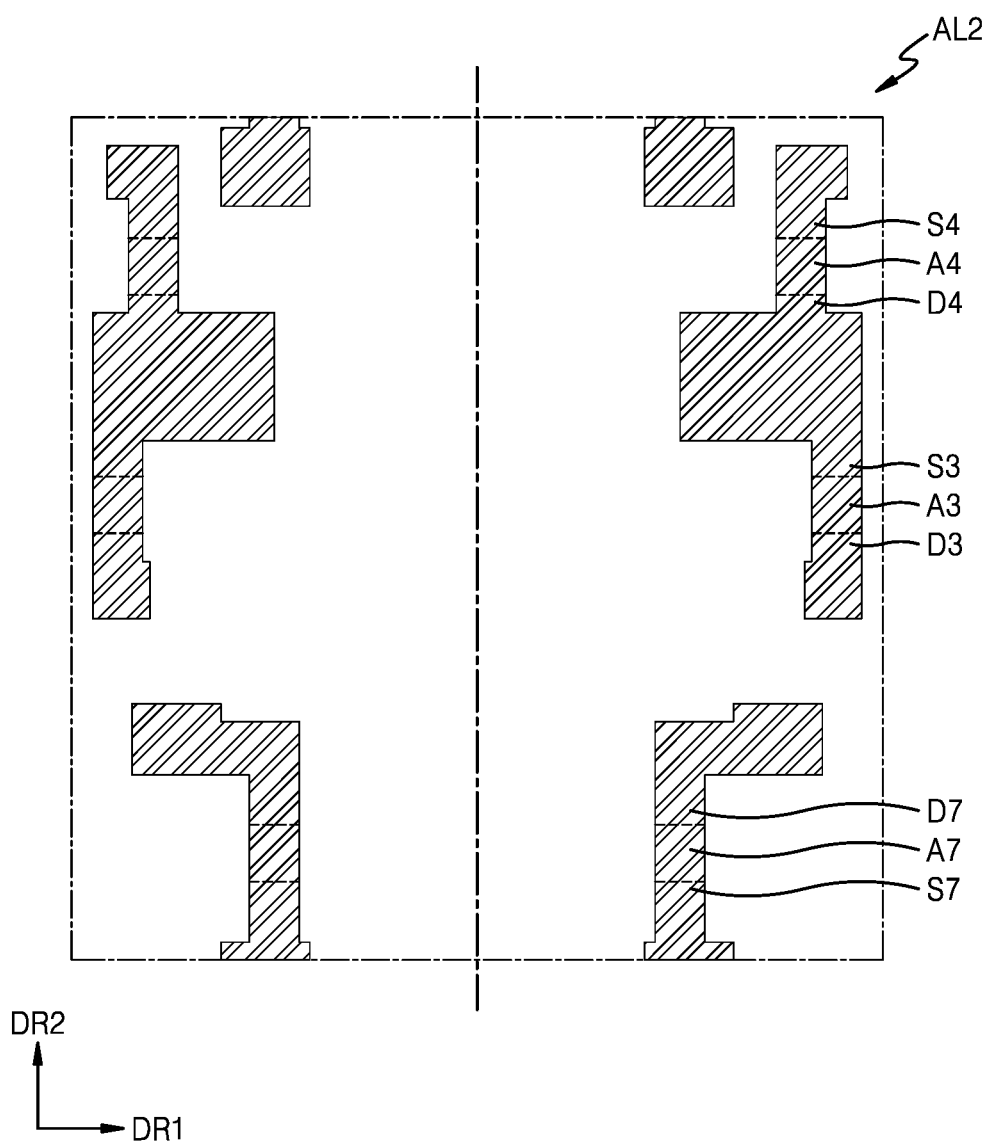

The second active layer AL2 shown in FIG. 8 may be a semiconductor layer including an oxide. For example, the second active layer AL2 may include a Zn oxide-based material such as Zn oxide, In—Zn oxide, Ga—In—Zn oxide, or the like within the spirit and the scope of the disclosure. Because various modifications may be made, the second active layer AL2 may include an oxide semiconductor such as In—Ga—Zn—O (IGZO), In—Sn—Zn—O (ITZO), or In—Ga—Sn—Zn—O (IGTZO) containing a metal, such as In, Ga, or Sn, in ZnO.

Figure 10:
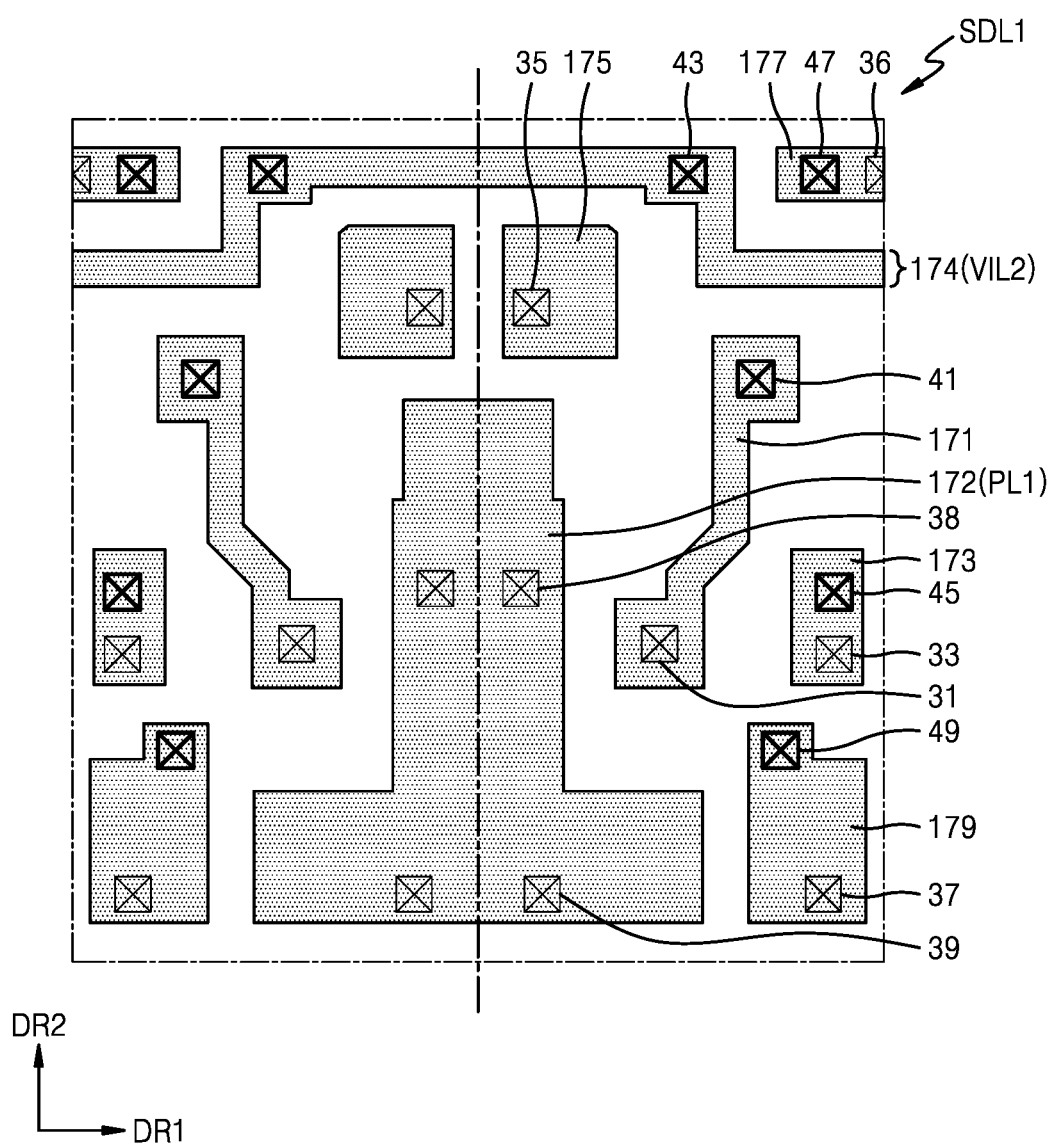
Figure 11:
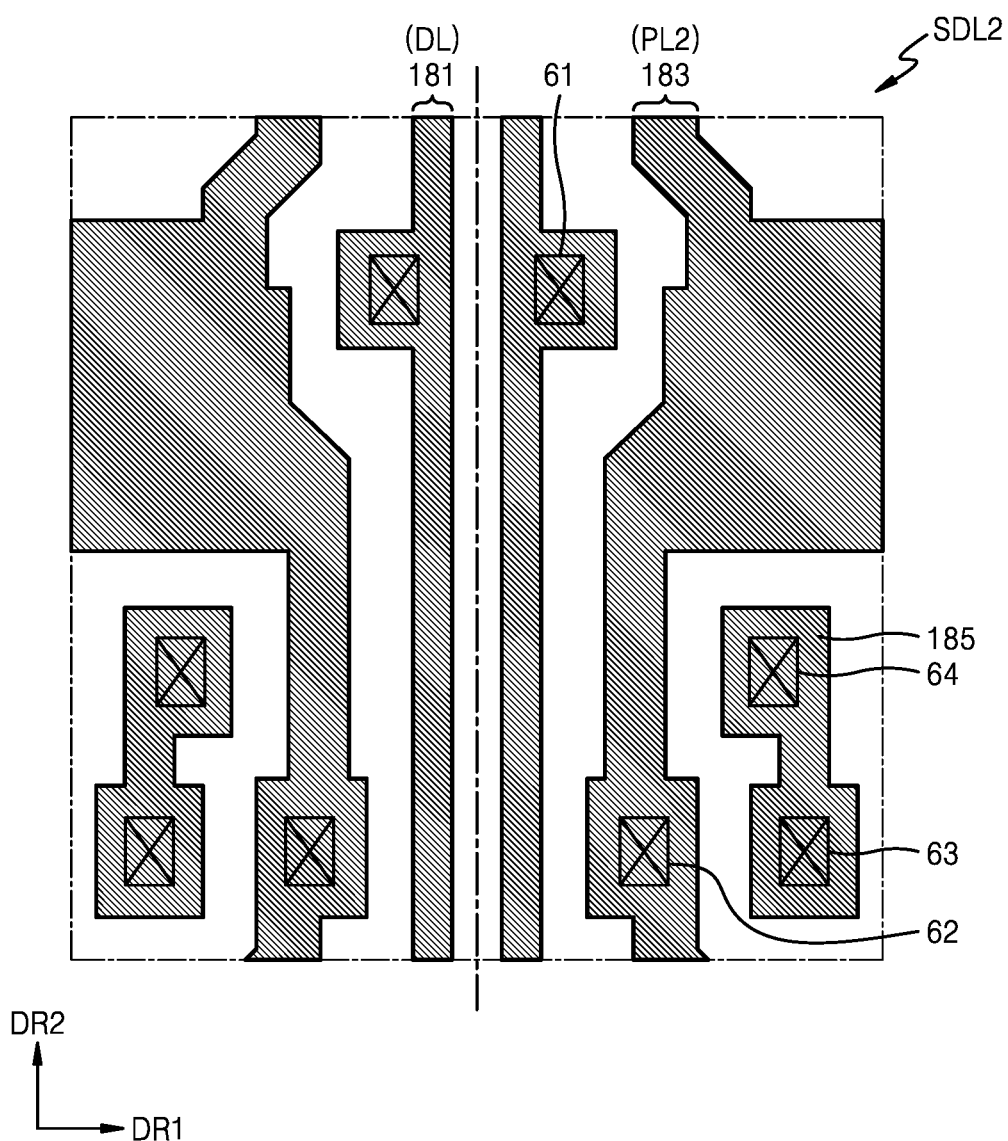

Each of the first source drain layer SDL1 shown in FIG. 10 and the second source drain layer SDL2 shown in FIG. 11 may include aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and/or copper (Cu). Each of these layers may have a single-layer structure or a multi-layer structure. When each of these layers has a multi-layered structure, it may include several materials. For example, each of the first source drain layer SDL1 shown in FIG. 10 and the second source drain layer SDL2 shown in FIG. 11 may have a two-layered structure of Ti layer/Al layer or may have a three-layered structure of Ti layer/Al layer/Ti layer.

By reference, contact holes 33, 35, 37, and 39 shown in FIG. 10 may be formed or disposed in the first through fourth gate insulating layers and the first interlayer insulating layer, and thus may electrically connect the layers shown in FIG. 10 to the first active layer AL1 shown in FIG. 5 located or disposed therebelow. A contact hole 38 shown in FIG. 10 may be formed or disposed in the third gate insulating layer, the fourth gate insulating layer, and the first interlayer insulating layer, and thus may electrically connect the layer shown in FIG. 10 to the second gate layer GL2 shown in FIG. 7. A contact hole 31 shown in FIG. 10 may be formed or disposed in the second through fourth gate insulating layers and the first interlayer insulating layer and thus may electrically connects a node connection line 171 shown in FIG. 10 to a first gate electrode G1 shown in FIG. 6 located or disposed therebelow. A contact hole 36 shown in FIG. 10 may be formed or disposed in the second through fourth gate insulating layers and the first interlayer insulating layer and thus may electrically connects a connection electrode 177 shown in FIG. 10 to a first initializing voltage line 137 of the first gate layer GL1 shown in FIG. 6 located or disposed therebelow. Contact holes 41, 43, 45, 47, and 49 shown in FIG. 10 may be formed or disposed in the fourth gate insulating layer and the first interlayer insulating layer, and thus may electrically connect the layers shown in FIG. 10 to the second active layer AL2 shown in FIG. 8 located or disposed therebelow.

Contact holes 61, 62, and 63 shown in FIG. 11 may be formed or disposed in the second gate insulating layer and thus may electrically connect the layers shown in FIG. 11 to the first source drain layer SDL1 shown in FIG. 10 located or disposed therebelow. By reference, a contact hole 64 is illustrated in FIG. 11 for convenience of explanation, but is not a contact hole that electrically connects a connection electrode 185 to a layer located or disposed therebelow. The contact hole 64 may be formed in a planarization layer covering or overlapping the second source drain layer SDL2 shown in FIG. 11, and thus may electrically connect a pixel electrode of the organic light-emitting diode OLED located or disposed on the planarization layer to the connection electrode 185. The planarization layer may include an organic material, such as, acrylic resin, benzocyclobutene (BCB), polyimide, or hexamethyldisiloxane (HMDSO). Of course, embodiments are not limited thereto, and the planarization layer may include an inorganic material as within the spirit and the scope of the disclosure, and may have a single-layer structure and a multi-layer structure.

A pixel circuit may include the scan line SL, the initializing line IL, the compensating control line CL, the light-emission control line EL, the first initializing voltage line VIL1, and the second initializing voltage line VIL2 each extending in the first direction DR1, and may include the data line DL and the first and second power supply voltage lines PL1 and PL2 each extending in the second direction DR2 intersecting the first direction DR1.

As shown in FIG. 6, the scan line SL (134), a lower light-emission control line 136 included in the light-emission control line EL, and the first initializing voltage line VIL1 (137) may include the same or similar material as a first gate electrode G1. In order words, the first gate layer GL1 may include the scan line SL (134), the lower light-emission control line 136, and the first initializing voltage line VIL1 (137), along with the first gate electrode G1. As shown in FIG. 10, the second initializing voltage line VIL2 (174) may include the same or similar material as connection electrodes 173, 175, 177, and 179, the node connection line 171, and a first power supply voltage line 172 (PL1) and may be located or disposed on the same layer on which the connection electrodes 173, 175, 177, and 179, the node connection line 171, and the first power supply voltage line 172 (PL1) may be located or disposed.

Some or a predetermined number of the lines may include two conductive layers arranged or disposed on different layers. For example, the initializing line IL may include a lower initializing line 143 and an upper initializing line 163 arranged or disposed on different layers. As shown in FIG. 7, the lower initializing line 143 may include the same or similar material as the fourth capacitor electrode CE4 of the storage capacitor Cst and may be located or disposed on the same layer on which the fourth capacitor electrode CE4 may be located or disposed. As shown in FIG. 9, the upper initializing line 163 may include the same or similar material as the second capacitor electrode CE2 of the bias capacitor Cbias and may be located or disposed on the same layer on which the second capacitor electrode CE2 may be located or disposed. That is, the third gate layer GL3 may comprise the second capacitor electrode CE2 disposed above the first capacitor electrode CE1.

The lower initializing line 143 located or disposed on the second gate layer GL2 and the upper initializing line 163 located or disposed on the third gate layer GL3 may at least partially overlap each other. The lower initializing line 143 and the upper initializing line 163 may be electrically connected to each other. For example, the lower initializing line 143 and the upper initializing line 163 may contact each other outside the display area DA, or may be electrically connected to each other by the connection electrode and the like within the spirit and the scope of the disclosure. Because a first portion as a portion G4a of the lower initializing line 143 and a second portion as a portion G4b of the upper initializing line 163 may be components of a fourth gate electrode G4 of the fourth transistor T4, the fourth transistor T4 may have a dual gate structure including control electrodes above and below the semiconductor layer, respectively. In other words, the first portion as the portion G4a of the lower initializing line 143 may be a 44' gate electrode and the second portion as the portion G4b of the upper initializing line 163 may be a $4\text{-}2^{nd}$ gate electrode, and thus the fourth gate electrode G4 of the fourth transistor T4 may take a dual gate structure including the 44' gate electrode and the $4\text{-}2^{nd}$ gate electrode. The lower initializing line 143 may have a protrusion 143P as shown in FIG. 7. When viewed in a direction perpendicular to the substrate, the protrusion 143P may completely cover or overlap a fourth active region A4 of a fourth semiconductor layer, such that the protrusion 143P may shield the fourth active region A4 from external light incident on an external surface of the substrate.

The compensating control line CL may also include a lower compensating control line 145 and an upper compensating control line 165 arranged or disposed on different layers. As shown in FIG. 7, the lower compensating control line 145 located or disposed on the second gate layer GL2 may include the same or similar material as the fourth capacitor electrode CE4 of the storage capacitor Cst and may be located or disposed on the same layer on which the fourth capacitor electrode CE4 may be located or disposed. As shown in FIG. 9, the upper compensating control line 165 located or disposed on the third gate layer GL3 may include the same or similar material as the second capacitor electrode CE2 of the bias capacitor Cbias and may be located or disposed on the same layer on which the second capacitor electrode CE2 may be located or disposed.

The lower compensating control line 145 and the upper compensating control line 165 may at least partially overlap each other. The lower compensating control line 145 and the upper compensating control line 165 may be electrically connected to each other. For example, the lower compensating control line 145 and the upper compensating control line 165 may contact each other outside the display area DA, or may be electrically connected to each other by the connection electrode and the like within the spirit and the scope of the disclosure. Because a portion G3a of the lower compensating control line 145 and a portion G3b of the upper compensating control line 165 may be components of a third gate electrode G3 of the third transistor T3, the third transistor T3 may have a dual gate structure including control electrodes disposed above and below the semiconductor layer, respectively. The lower compensating control line 145 may have a protrusion 145P as shown in FIG. 7. When viewed in the direction perpendicular to the substrate, the protrusion 145P may completely cover a third active region A3 of a third semiconductor layer, such that the protrusion 145P may shield the third active region A3 from external light incident on an external surface of the substrate.

The light-emission control line EL may also include the lower light-emission control line 136 and an upper light-emission control line 166 arranged or disposed on different layers. As shown in FIG. 6, the lower light-emission control line 136 located or disposed on the first gate layer GL1 may include the same or similar material as the first gate electrode G1 and may be located or disposed on the same layer on which the first gate electrode G1 may be located or disposed. As shown in FIG. 9, the upper light-emission control line 166 located or disposed on the third gate layer GL3 may include the same or similar material as the second capacitor electrode CE2 of the bias capacitor Cbias and may be located or disposed on the same layer on which the second capacitor electrode CE2 may be located or disposed. In detail, the upper light-emission control line 166 and the second capacitor electrode CE2 may be integrally formed as a single body.

The lower light-emission control line 136 and the upper light-emission control line 166 may at least partially overlap each other. The lower light-emission control line 136 and the upper light-emission control line 166 may be electrically connected to each other. For example, the lower light-emission control line 136 and the upper light-emission control line 166 may contact each other outside the display area DA, or may be electrically connected to each other by the connection electrode and the like within the spirit and the scope of the disclosure. Because a third portion as a portion G7a of the lower light-emission control line 136 and a fourth portion as a portion G7b of the upper light-emission control line 166 may be portions overlapping the second active layer AL2 and thus may be components of the seventh gate electrode G7 of the seventh transistor T7, the seventh transistor T7 may have a dual gate structure including control electrodes disposed above and below the semiconductor layer, respectively. In other words, the third portion as the portion G7a of the lower light-emission control line 136 may be a $7\text{-}1^{st}$ gate electrode and the fourth portion as the portion G7b of the upper light-emission control line 166 may be a $7\text{-}2^{nd}$ gate electrode, and the seventh gate electrode G7 of the seventh transistor T7 may take a dual gate structure including the $7\text{-}1^{st}$ gate electrode and the $7\text{-}2^{nd}$ gate electrode.

The pixel circuit may include the first, second, third, fourth, fifth, sixth, and seventh transistors T1, T2, T3, T4, T5, T6, and T7, the storage capacitor Cst, and the bias capacitor Cbias.

The first transistor T1, the second transistor T2, the fifth transistor T5, and the sixth transistor T6 may be thin-film transistors each including a silicon semiconductor. The third transistor T3, the fourth transistor T4, and the seventh transistor T7 may be thin-film transistors each including an oxide semiconductor.

The semiconductor layers of the first transistor T1, the second transistor T2, the fifth transistor T5, and the sixth transistor T6 may be arranged or disposed on the same layer as shown in FIG. 5, and may include the same or similar materials. For example, the semiconductor layers of the first transistor T1, the second transistor T2, the fifth transistor T5, and the sixth transistor T6 may include polycrystalline silicon. The semiconductor layers of the first transistor T1, the second transistor T2, the fifth transistor T5, and the sixth transistor T6 may be electrically connected to each other and may be curved in various shapes as shown in FIG. 5.

Each of the semiconductor layers of the first transistor T1, the second transistor T2, the fifth transistor T5, and the sixth transistor T6 may include an active region, and a source region and a drain region on both sides of the active region. For example, the source region and the drain region may be doped with impurities that may include N-type impurities or P-type impurities. The source region and the drain region may correspond to a source electrode and a drain electrode, respectively. The source region and the drain region may be interchanged to each other according to the polarity of a transistor. Hereinafter, a source region and a drain region may be used instead of a source electrode and a drain electrode.

The first transistor T1 may include a first semiconductor layer and the first gate electrode G1. The first semiconductor layer may include a first active region A1, and a first source region S1 and a first drain region D1 respectively on both sides of the first active region A1. The first semiconductor layer may have a substantially curved shape, and thus the first active region A1 may be longer than other active regions A2 through A7. For example, the first semiconductor layer may have a long channel within a narrow space by having a shape obtained by bending actions, such as 'ㄷ', 'ㄹ', 'S', 'M', or 'W'. Because the first active region A1 may be long, the driving range of a gate voltage applied to the first gate electrode G1 may widen. Accordingly, the grayscale of light emitted by the organic light-emitting diode OLED may be precisely controlled, and a display quality may be improved. As an example, the first semiconductor layer may have a substantially straight line shape instead of a bent shape. The first gate electrode G1 may have a substantially island or isolated shape as shown in FIG. 6, and thus may be arranged or disposed to overlap the first active region A1. As described above, the first gate insulating layer may be disposed between the first active region A1 and the first gate electrode G1. In addition, as shown in FIG. 6, the first gate layer GL1 may comprise the first gate electrode G1 disposed above the first active region A1. For example, as shown in FIGS. 2 and 4-11, current flows from the first active region A1 to the first drain region D1 in response to a voltage applied to the first gate electrode G1 to control brightness of the organic light-emitting diode OLED.

The storage capacitor Cst may be arranged or disposed to overlap the first transistor T1. The storage capacitor Cst may include the third capacitor electrode CE3 and the fourth capacitor electrode CE4. The first gate electrode G1 may not only function as a control electrode of the first transistor T1 but may also function as the third capacitor electrode CE3 of the storage capacitor Cst. In other words, the first gate electrode G1 and the third capacitor electrode CE3 may be integrally formed as a single body. The fourth capacitor electrode CE4 of the storage capacitor Cst may be arranged or disposed to overlap the third capacitor electrode CE3. Because the second gate insulating layer may be disposed between the third capacitor electrode CE3 and the fourth capacitor electrode CE4 as described above, the second gate insulating layer may serve as a dielectric layer of the storage capacitor Cst.

The fourth capacitor electrode CE4 may include an opening SOP. The opening SOP may be formed by removing a portion of the fourth capacitor electrode CE4, and thus may have a closed shape. The contact hole 31 formed or disposed in the second through fourth gate insulating layers and the first interlayer insulating layer and thus electrically connecting the node connection line 171 shown in FIG. 10 to the first gate electrode G1 shown in FIG. 6 located or disposed therebelow may be located or disposed within the opening SOP.

Fourth capacitor electrodes CE4 of neighboring or adjacent pixels may be electrically connected to each other by a bridge 141. The bridge 141 may be a protrusion from the fourth capacitor electrode CE4 in the first direction DR1, and thus the bridge 141 and the fourth capacitor electrode CE4 may be integrally formed as a single body.

The node connection line 171 located or disposed in the first source drain layer SDL1 may be electrically connected to the third capacitor electrode CE3 via the contact hole 31, and may also be electrically connected to a third semiconductor layer of the third transistor T3 via the contact hole 41. The fourth capacitor electrode CE4 may be electrically connected to the first power supply voltage line 172 (PL1) located or disposed on the first source drain layer SDL1 above the fourth capacitor electrode CE4 via the contact hole 38, and the first power supply voltage line 172 (PL1) may be electrically connected to a second power supply voltage line 183 of the second source drain layer SDL2 via the contact hole 62. The first power supply voltage line 172 (PL1) and the second power supply voltage line 183 (PL2) may each extend in the second direction DR2. The fourth capacitor electrode CE4 may extend in the first direction DR1, and thus may transmit the power supply voltage ELVDD in the first direction DR1. Accordingly, first power supply voltage lines 172 (PL1), second power supply voltage lines 183 (PL2), and fourth capacitor electrodes CE4 in the display area DA are illustrated as having a mesh structure in a plan view.

The second transistor T2 may include a second semiconductor layer and a second gate electrode G2. The second semiconductor layer may include a second active region A2, and a second source region S2 and a second drain region D2 respectively disposed on both sides of the second active region A2. The second source region S2 may be electrically connected to the connection electrode 175 located or disposed on the first source drain layer SDL1 above the second source region S2 via the contact hole 35, and the connection electrode 175 may be electrically connected to a data line 181 located or disposed on the second source drain layer SDL2 via the contact hole 61, and consequently, the second source region S2 may be electrically connected to the data line 181. The second drain region D2 may be electrically connected to the first source region S1 of the first transistor T1. In other words, the first capacitor electrode CE1 of the bias capacitor Cbias which will be described later may include a semiconductor layer located or disposed on a same layer on which the first semiconductor layer or the second semiconductor layer may be located or disposed as shown in FIG. 5, and thus the second drain region D2 may be electrically connected to the first source region S1 of the first transistor T1 via the first capacitor electrode CE1. The second gate electrode G2 may be a portion of the scan line 134 that may overlap the second semiconductor layer.

The fifth transistor T5 may include a fifth semiconductor layer and a fifth gate electrode G5. The fifth semiconductor layer may include a fifth active region A5, and a fifth source region S5 and a fifth drain region D5 respectively disposed on both sides of the fifth active region A5. The fifth source region S5 may be electrically connected to the first power supply voltage line 172 (PL1) via the contact hole 39, and the fifth drain region D5 may be electrically connected to the first source region S1. The fifth gate electrode G5 may be a portion of the lower light-emission control line 136 that may overlap the first active layer AL1.

The sixth transistor T6 may include a sixth semiconductor layer and a sixth gate electrode G6. The sixth semiconductor layer may include a sixth active region A6, and a sixth source region S6 and a sixth drain region D6 respectively disposed on both sides of the sixth active region A6. The sixth source region S6 may be electrically connected to the first drain region D1. The sixth drain region D6 may be electrically connected to the connection electrode 179 located or disposed on the first source drain layer SDL1 above the sixth drain region D6 via the contact hole 37, and the connection electrode 179 may be electrically connected to the connection electrode 185 located or disposed on the second source drain layer SDL2 above the connection electrode 179 via the contact hole 63, and the connection electrode 185 may be electrically connected to the pixel electrode of the organic light-emitting diode OLED located or disposed on the connection electrode 185 via the contact hole 64, and consequently, the sixth drain region D6 may be electrically connected to the pixel electrode. The sixth gate electrode G6 may be a portion of the lower light-emission control line 136 that may overlap the first active layer AL1.

As described above, the second active layer AL2 may include an oxide semiconductor. The third transistor T3, the fourth transistor T4, and the seventh transistor T7 may include, as their components, portions of the second active layer AL2, as shown in FIG. 8.

The second active layer AL2 including an oxide semiconductor may include an active region, and a source region and a drain region respectively disposed on both sides of the active region. For example, the source region and the drain region may be obtained by increasing the carrier concentration of the oxide semiconductor by performing plasma processing on the oxide semiconductor, the plasma processing using a hydrogen (H)-based gas, a fluorine (F)-based gas, or a combination thereof. The source region and the drain region may correspond to a source electrode and a drain electrode, respectively. Hereinafter, a source region and a drain region may be used instead of a source electrode and a drain electrode.

The third transistor T3 may include the third semiconductor layer including an oxide semiconductor, and the third gate electrode G3. The third semiconductor layer may include the third active region A3, and a third source region S3 and a third drain region D3 respectively disposed on both sides of the third active region A3. The third source region S3 may be electrically connected to the node connection line 171 via the contact hole 41, and the node connection line 171 may be electrically connected to the first gate electrode G1 via the contact hole 31, and consequently, the third source region S3 may be electrically connected to the first gate electrode G1. The third source region S3 may be electrically connected to a fourth drain region D4 arranged or disposed on the same layer on which the third source region S3 may be arranged or disposed. The third drain region D3 may be electrically connected to the connection electrode 173 via the contact hole 45, and the connection electrode 173 may be electrically connected to the first semiconductor layer of the first transistor T1 and the sixth semiconductor layer of the sixth transistor T6 via the contact hole 33, and thus the third drain region D3 may be electrically connected to the first semiconductor layer of the first transistor T1 and the sixth semiconductor layer of the sixth transistor T6. The third gate electrode G3 may include a portion G3b of the upper compensating control line 165 intersecting the second active layer AL2, and a portion G3a of the lower compensating control line 145 intersecting the second active layer AL2. In other words, the third gate electrode G3 may have a dual gate structure including control electrodes above and below the semiconductor layer, respectively.

The fourth transistor T4 may include the fourth semiconductor layer including an oxide semiconductor, and a fourth gate electrode G4. The fourth semiconductor layer may include the fourth active region A4, and a fourth source region S4 and a fourth drain region D4 respectively disposed on both sides of the fourth active region A4. The fourth source region S4 may be electrically connected to the connection electrode 177 located or disposed on the first source drain layer SDL1 above the fourth source region S4 via the contact hole 47, and the connection electrode 177 may be electrically connected to the first initializing voltage line 137 via the contact hole 36, and consequently, the fourth source region S4 may be electrically connected to the first initializing voltage line 137. The fourth drain region D4 may be electrically connected to the node connection line 171 via the contact hole 41, and the node connection line 171 may be electrically connected to the first gate electrode G1 via the contact hole 31, and thus the fourth drain region D4 may be electrically connected to the first gate electrode G1. The fourth gate electrode G4 may include a portion G4b of the upper initializing line 163 intersecting the second active layer AL2, and a portion G4a of the lower initializing line 143 intersecting the second active layer AL2. In other words, the fourth gate electrode G4 may have a dual gate structure including control electrodes disposed above and below the semiconductor layer, respectively.

The seventh transistor T7 may include a seventh semiconductor layer and a seventh gate electrode G7. The seventh semiconductor layer may include a seventh active region A7, and a seventh source region S7 and a seventh drain region D7 respectively disposed on both sides of the seventh active region A7. The seventh source region S7 may be electrically connected to the second initializing voltage line 174 located or disposed on the first source drain layer SDL1 above the seventh source region S7, via the contact hole 43. The seventh drain region D7 may be electrically connected to the connection electrode 179 via the contact hole 49, and the connection electrode 179 may be electrically connected to the sixth drain region D6 via the contact hole 37, and thus the seventh drain region D7 may be electrically connected to the sixth drain region D6. The seventh gate electrode G7 may include a portion G7b of the upper light-emission control line 166 overlapping the second active layer AL2, and a portion G7a of the lower light-emission control line 136 overlapping the second active layer AL2. In other words, the seventh gate electrode G7 may have a dual gate structure including control electrodes disposed above and below the semiconductor layer, respectively.

The bias capacitor Cbias may include the first capacitor electrode CE1 and the second capacitor electrode CE2. The first capacitor electrode CE1 may be located or disposed on the first active layer AL1, as shown in FIG. 5. In detail, the first capacitor electrode CE1 may be obtained by doping a polycrystalline silicon layer with impurities as described above. The first capacitor electrode CE1, the first source region S1 of the first transistor T1, and the fifth drain region D5 of the fifth transistor T5 may be integrally formed as a single body. The second capacitor electrode CE2 may be arranged or disposed to overlap the first capacitor electrode CE1. As shown in FIG. 9, the second capacitor electrode CE2 may be a portion of the upper light-emission control line 166 included in the light-emission control line EL. In other words, the upper light-emission control line 166 and the second capacitor electrode CE2 may be integrally formed as a single body. Because the first through fourth gate insulating layers may be disposed between the first capacitor electrode CE1 and the second capacitor electrode CE2, the first through fourth gate insulating layers may serve as a dielectric layer of the bias capacitor Cbias. As shown in FIG. 9, two neighboring or adjacent pixels on an i-th row may share the second capacitor electrode CE2.

Because the display device according to an embodiment may include the bias capacitor Cbias, the first transistor T1 may be rendered into an on-bias state, and accordingly, a hysteresis issue and a step efficiency issue may not be generated or generation rates thereof may be minimized. Accordingly, an organic light-emitting display device that displays a high-quality image may be realized. As shown in FIG. 5, the first capacitor electrode CE1 of the bias capacitor Cbias may include the semiconductor layer of the second active layer AL2, and thus the first capacitor electrode CE1 may be located or disposed on the same layer on which the first semiconductor layer of the first transistor T1 or the second semiconductor layer of the second transistor T2 may be located or disposed. Thus, compared with a case where the first capacitor electrode CE1 may be formed or disposed on a separate layer and may be electrically connected to the first semiconductor layer of the first transistor T1 or the second semiconductor layer of the second transistor T2 via a contact hole or the like, each pixel may have a simple structure. Because each pixel may have a simple structure, a high-resolution organic light-emitting display device may be realized.

As shown in FIG. 9, the second capacitor electrode CE2 of the bias capacitor Cbias may include the same or similar material as the upper initializing line 163, the upper compensating control line 165, and the upper light-emission control line 166 and may be located or disposed on the same layer on which the upper initializing line 163, the upper compensating control line 165, and the upper light-emission control line 166 may be located or disposed. For example, the second capacitor electrode CE2 and the upper light-emission control line 166 may be integrally formed as a single body. Thus, compared with a case where the second capacitor electrode CE2 may be formed or disposed on a separate layer and may be electrically connected to the upper light-emission control line 166 or the lower light-emission control line 136 via a contact hole or the like, each pixel may have a simple structure. Because each pixel may have a simple structure, a high-resolution organic light-emitting display device may be realized.

Figure 12:
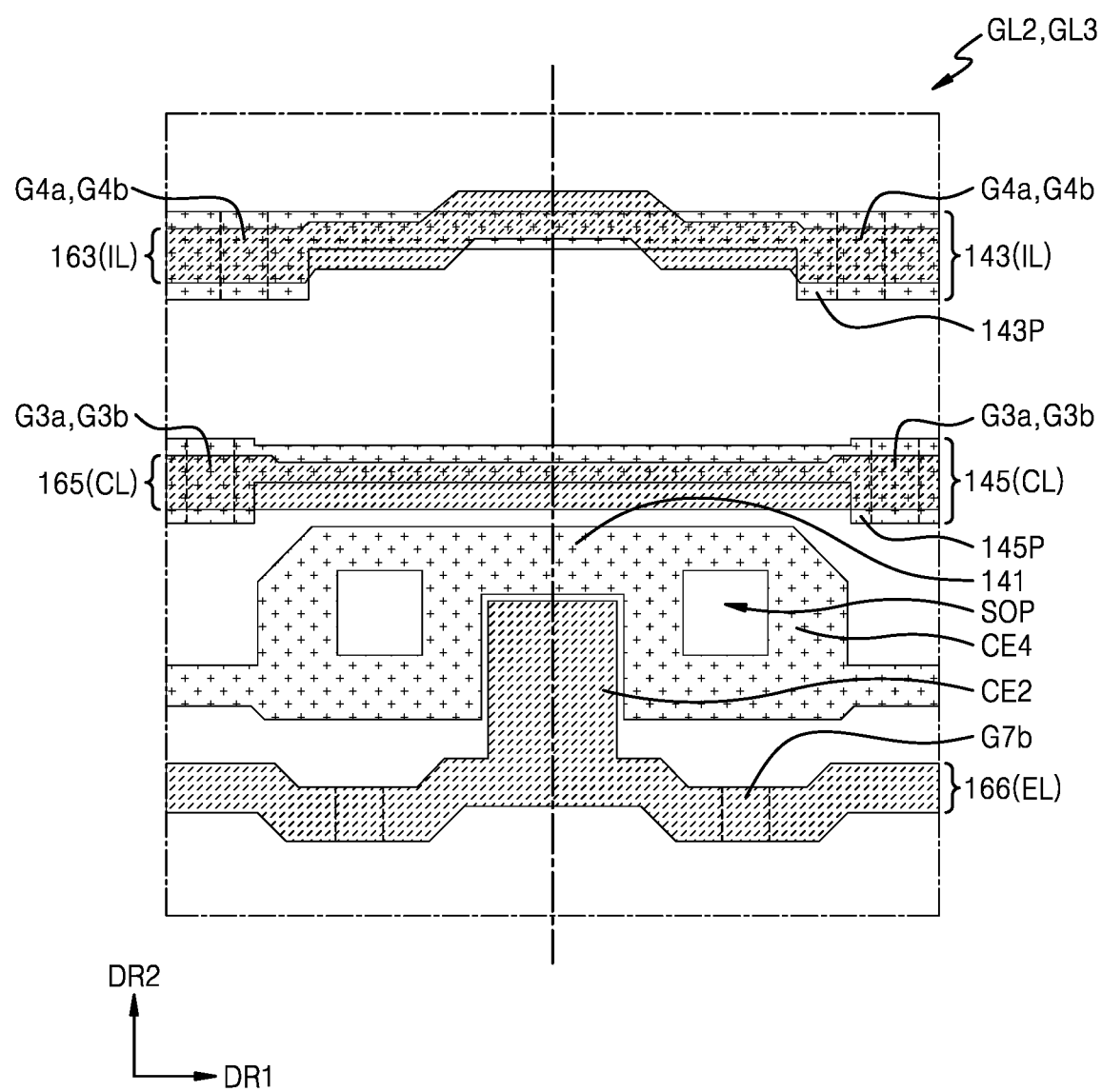
FIG. 12 is a layout view of some extracted portions of FIG. 4.
Figure 13:
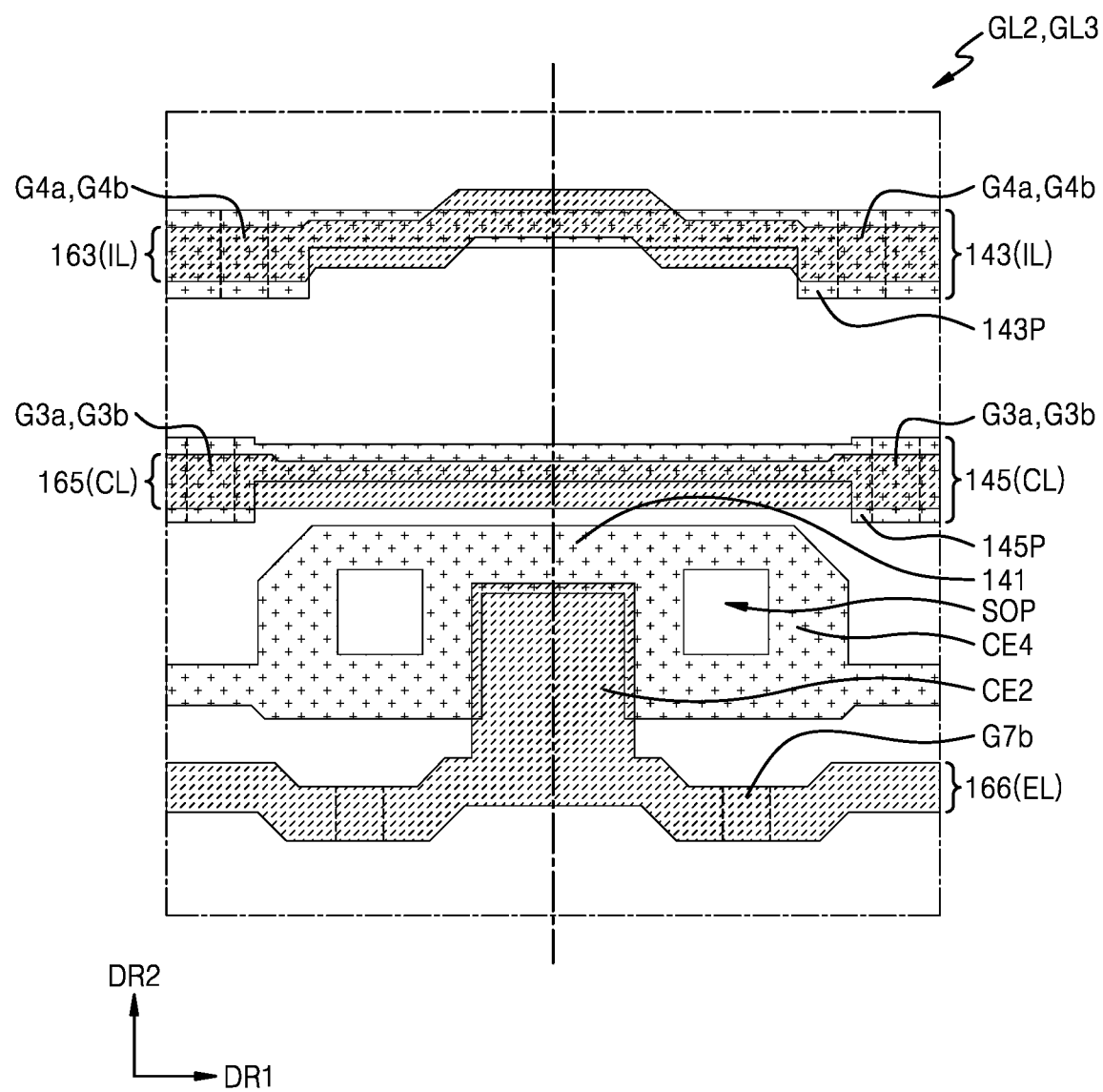
FIG. 13 is a layout view of some of the layers of components such as transistors and capacitors included in a display device according to an embodiment.

FIG. 12 is a layout view of some or a predetermined number of extracted portions shown in FIG. 4. As shown in FIG. 12, the second capacitor electrode CE2 of the bias capacitor Cbias may not overlap the fourth capacitor electrode CE4 of the storage capacitor Cst located or disposed below the second capacitor electrode CE2, and the bridge 141 electrically connected to the fourth capacitor electrode CE4. However, as shown in FIG. 13, which is a layout view of some or a predetermined number of the layers of components such as transistors and capacitors included in a display device according to an embodiment, the second capacitor electrode CE2 of the bias capacitor Cbias may be located or disposed above a layer that may cover or overlap the fourth capacitor electrode CE4 of the storage capacitor Cst such that a portion of the second capacitor electrode CE2 may overlap a portion of the fourth capacitor electrode CE4. In detail, at least some or a predetermined number of the edges of the second capacitor electrode CE2 may overlap the fourth capacitor electrode CE4 and the bridge 141 electrically connected thereto.

As described above, the bias capacitor Cbias may render the first transistor T1 into an on-bias state. To this end, by maximally increasing an area where the first capacitor electrode CE1 and the second capacitor electrode CE2 of the bias capacitor Cbias may overlap each other, the bias capacitor Cbias needs to have a sufficient electrostatic capacity. In detail, at least some or a predetermined number of the edges of the second capacitor electrode CE2 are made overlap the fourth capacitor electrode CE4 and the bridge 141 electrically connected thereto such that a portion of the second capacitor electrode CE2 may overlap a portion of the fourth capacitor electrode CE4, and thus an influence of a tolerance or the like during the manufacture of the display device may be minimized and also the electrostatic capacity of the bias capacitor Cbias may be maximized.

Although organic light emitting display devices have been described above, embodiments are not limited thereto. A pixel having a structure as described above falls within the scope of the disclosure. For example, when a pixel having the pixel circuit described above with reference to FIG. 2 or a pixel circuit similar thereto may be a pixel in which the first capacitor electrode CE1 of the bias capacitor Cbias may be located or disposed on the same layer on which the first semiconductor layer of the first transistor T1 may be located or disposed, and the second capacitor electrode CE2 of the bias capacitor Cbias may be located or disposed on the same layer on which the second portion G4b included in the fourth gate electrode G4 of the fourth transistor T4, this falls within the scope of the disclosure. Of course, a display device having such a pixel falls within the scope of the disclosure.

According to embodiments of the disclosure as described above, a pixel capable of achieving high-resolution display that enables a high-quality image display, and an organic light-emitting display device including the pixel may be implemented. Of course, the scope of the disclosure is not limited thereto.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A pixel comprising:
   an organic light-emitting diode;
   a first transistor that receives a signal in response to a voltage applied to a first node and controls an amount of current flowing from a second node electrically connected to a power supply voltage line to the organic light-emitting diode;
   a fourth transistor electrically connected between the first node and a first initializing voltage line; and
   a bias capacitor electrically connected between the second node and a light-emission control line, the bias capacitor including a first capacitor electrode and a second capacitor electrode, wherein
   the first capacitor electrode of the bias capacitor and a semiconductor layer of the first transistor are disposed on a same layer, and
   the second capacitor electrode of the bias capacitor and a second portion included in a gate electrode of the fourth transistor are disposed on a same layer.

2. The pixel of claim 1, further comprising:
a second transistor electrically connected between the second node and a data line and turned on by a scan signal,
wherein the second capacitor electrode is disposed above a layer that overlaps a gate electrode of the second transistor.

3. The pixel of claim 1, wherein
the gate electrode of the fourth transistor includes a first portion located below the second portion, and
the first portion and a gate electrode of the first transistor are disposed on a same layer.

4. The pixel of claim 3, wherein
the gate electrode of the first transistor is disposed over the semiconductor layer of the first transistor, and
the first portion is disposed on a layer that overlaps the gate electrode of the first transistor.

5. The pixel of claim 3, wherein
the gate electrode of the first transistor is disposed over the semiconductor layer of the first transistor,
the first portion is located on a layer that overlaps the gate electrode of the first transistor,
a semiconductor layer of the fourth transistor is disposed over the first portion, and
the second capacitor electrode is disposed on a layer that overlaps the semiconductor layer of the fourth transistor.

6. The pixel of claim 5, wherein
the semiconductor layer of the first transistor includes a silicon semiconductor, and
the semiconductor layer of the fourth transistor includes an oxide semiconductor.

7. The pixel of claim 1, further comprising:
a sixth transistor electrically connected between the first transistor and the organic light-emitting diode and turned on by a light-emission control signal applied to the light-emission control line.

8. The pixel of claim 7, further comprising:
a seventh transistor electrically connected between the sixth transistor and a second initializing voltage line,
wherein the second capacitor electrode and a fourth portion included in a gate electrode of the seventh transistor are integrally formed as a single body.

9. The pixel of claim 8, wherein
the gate electrode of the seventh transistor includes a third portion located below the fourth portion,
the third portion and the gate electrode of the first transistor are disposed on a same layer,
the gate electrode of the first transistor is disposed over the semiconductor layer of the first transistor,
the third portion is located on a layer that overlaps the gate electrode of the first transistor,
a semiconductor layer of the seventh transistor is disposed over the third portion, and
the second capacitor electrode is disposed on a layer that overlaps the semiconductor layer of the seventh transistor.

10. The pixel of claim 1, further comprising:
a storage capacitor electrically connected between the first node and the power supply voltage line, wherein
a third capacitor electrode of the storage capacitor and a first gate electrode of the first transistor are integrally formed as a single body,
a fourth capacitor electrode of the storage capacitor is disposed above the third capacitor electrode,
the second capacitor electrode is disposed on a layer that overlaps the fourth capacitor electrode, and
a portion of the second capacitor electrode overlaps a portion of the fourth capacitor electrode.

11. An organic light-emitting display device comprising:
a substrate;
a first active layer disposed over the substrate and comprising:
a first source region;
a first active region adjacent to the first source region;
a first drain region adjacent to the first active region; and
a first capacitor electrode electrically connected to the first source region;
a first gate layer comprising a first gate electrode disposed above the first active region;
a third gate layer comprising a second capacitor electrode disposed above the first capacitor electrode; and
an organic light-emitting diode,
wherein current flows from the first active region to the first drain region in response to a voltage applied to the first gate electrode to control brightness of the organic light-emitting diode.

12. The organic light-emitting display device of claim 11, wherein
the first active layer comprises:
a second source region adjacent to the first active region;
a second drain region electrically connected to the first source region; and
a second active region adjacent to the second drain region, and
the first gate layer comprises a second gate electrode which is a part of a scan line that overlaps the second active region.

13. The organic light-emitting display device of claim 11, further comprising:
a second gate layer comprising a 4-$1^{st}$ gate electrode which is a part of a lower initializing line and disposed on a layer overlapping the first gate layer; and
a second active layer disposed on a layer overlapping the second gate layer, the second active layer comprising a fourth active region that overlaps the 4-$1^{st}$ gate electrode,
wherein the third gate layer is disposed on a layer overlapping the second active layer, and comprises a 4-$2^{nd}$ gate electrode which is a part of an upper initializing line and overlaps the fourth active region.

14. The organic light-emitting display device of claim 13, wherein
the first active layer includes a silicon semiconductor, and
the second active layer includes an oxide semiconductor.

15. The organic light-emitting display device of claim 13, wherein
the first active layer comprises:
a sixth source region electrically connected to the first drain region;
a sixth active region adjacent to the sixth source region; and
a sixth drain region adjacent to the sixth active region,
the first gate layer further comprises a sixth gate electrode overlapping the sixth active region, the sixth gate electrode being a part of a lower light-emission control line included in a light-emission control line, and
a pixel electrode of the organic light-emitting diode is electrically connected to the sixth drain region.

16. The organic light-emitting display device of claim 15, wherein
- the second active layer comprises a seventh active region,
- the first gate layer comprises a 7-$1^{st}$ gate electrode which is a part of the lower light-emission control line and overlaps the seventh active region,
- the third gate layer comprises a 7-$2^{nd}$ gate electrode overlapping the seventh active region,
- the 7-$2^{nd}$ gate electrode is a part of an upper light-emission control line included in the light-emission control line, and
- the 7-$2^{nd}$ gate electrode and the second capacitor electrode are integrally formed as a single body.

17. The organic light-emitting display device of claim 13, further comprising a third capacitor electrode, the third capacitor electrode and the first gate electrode being integrally formed as a single body,
- wherein the second gate layer comprises a fourth capacitor electrode overlapping the third capacitor electrode and electrically connected to a power supply voltage line.

18. The organic light-emitting display device of claim 17, wherein a portion of the second capacitor electrode overlaps a portion of the fourth capacitor electrode.

19. The organic light-emitting display device of claim 11, wherein the first source region and the first capacitor electrode are integrally formed as a single body.

\* \* \* \* \*